(12) United States Patent
Tachibana et al.

(10) Patent No.: US 8,349,623 B2
(45) Date of Patent: Jan. 8, 2013

(54) METHOD AND APPARATUS FOR MANUFACTURING THIN FILM PHOTOELECTRIC CONVERSION MODULE

(75) Inventors: Shinsuke Tachibana, Osaka (JP); Takanori Nakano, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 163 days.

(21) Appl. No.: 12/672,128

(22) PCT Filed: Aug. 1, 2008

(86) PCT No.: PCT/JP2008/063889
§ 371 (c)(1),
(2), (4) Date: Feb. 4, 2010

(87) PCT Pub. No.: WO2009/020073
PCT Pub. Date: Feb. 12, 2009

(65) Prior Publication Data
US 2011/0250709 A1  Oct. 13, 2011

(30) Foreign Application Priority Data

Aug. 6, 2007 (JP) .................................. 2007-204426

(51) Int. Cl.
*H01L 21/00* (2006.01)
(52) U.S. Cl. ......... 438/12; 438/4; 438/10; 257/E27.124; 136/243; 324/718; 361/212
(58) Field of Classification Search .................. 136/243, 136/244, 258; 361/212, 225; 257/E27.124; 324/718; 438/4, 10, 12, 48, 57, 84, 85, 86, 438/88, 90
See application file for complete search history.

(56) References Cited

U.S. PATENT DOCUMENTS

| 4,481,230 A | 11/1984 | Hanak |
| 4,725,558 A | 2/1988 | Yamazaki et al. |
| 4,806,496 A * | 2/1989 | Suzuki et al. .................. 438/12 |
| 6,365,825 B1 * | 4/2002 | Hayashi et al. ............... 136/243 |
| 2002/0139411 A1 * | 10/2002 | Hiraishi et al. ............... 136/244 |

FOREIGN PATENT DOCUMENTS

| EP | 1 079 441 A2 | 2/2001 |
| EP | 1 258 925 A2 | 11/2002 |
| JP | 62-176174 | 8/1987 |
| JP | 10-004202 | 1/1998 |
| JP | 2000-323738 | 11/2000 |
| JP | 2001-298203 | 10/2001 |
| JP | 2002-076380 | 3/2002 |
| JP | 2005-135941 | 5/2005 |
| JP | 2005-311180 | 11/2005 |
| WO | 2008/041454 | 4/2008 |

OTHER PUBLICATIONS

Supplementary Search Report mailed Jun. 29, 2011 in EP application 08792102.9.

\* cited by examiner

*Primary Examiner* — William D Coleman
*Assistant Examiner* — Su Kim
(74) *Attorney, Agent, or Firm* — Nixon & Vanderhye P.C.

(57) ABSTRACT

A method for manufacturing a thin film photoelectric conversion module comprising the steps of: (A) forming a plurality of divided strings by dividing a string, in which thin film photoelectric conversion elements provided by sequentially laminating a first electrode layer, a photoelectric conversion layer and a second electrode layer on the surface of an insulating substrate are electrically connected in series, into a plurality of strings by dividing grooves, electrically insulating and separating the first electrode layer and the second electrode layer one from the other and extending in a serial connection direction; and (B) performing reverse biasing by applying a reverse bias voltage to each of thin film photoelectric conversion elements of the divided string.

8 Claims, 14 Drawing Sheets

Fig.14
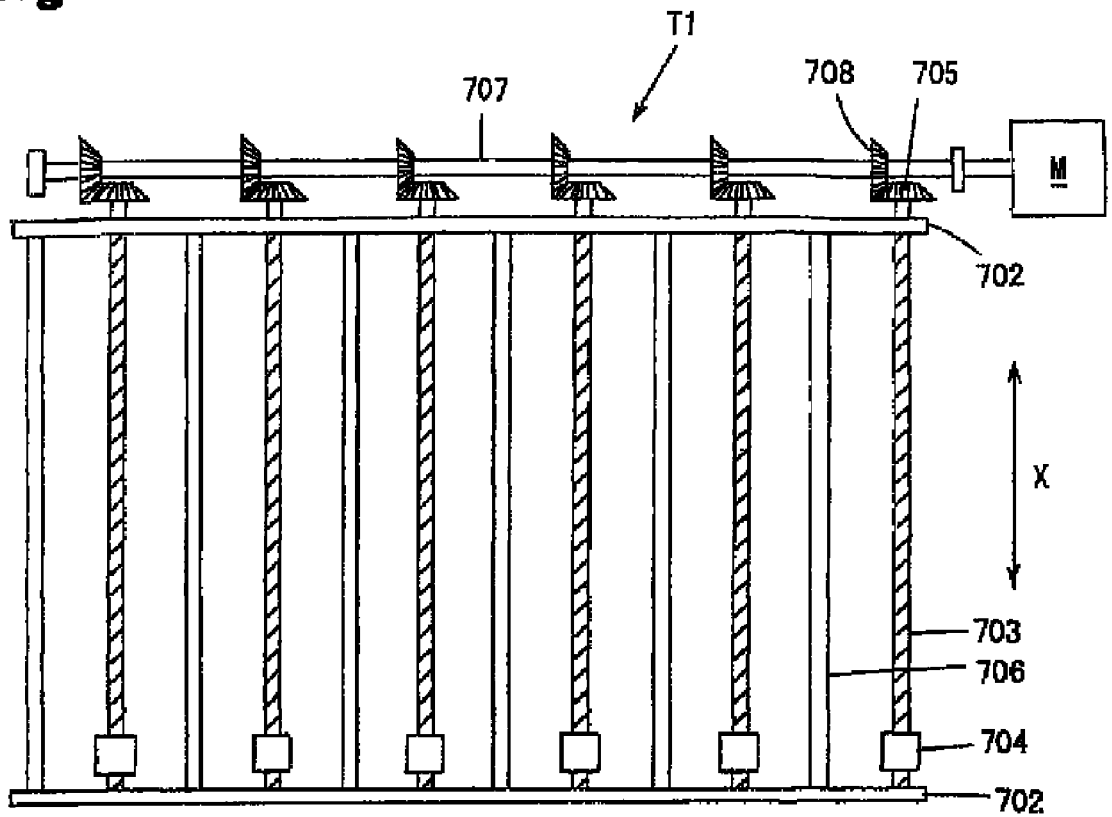
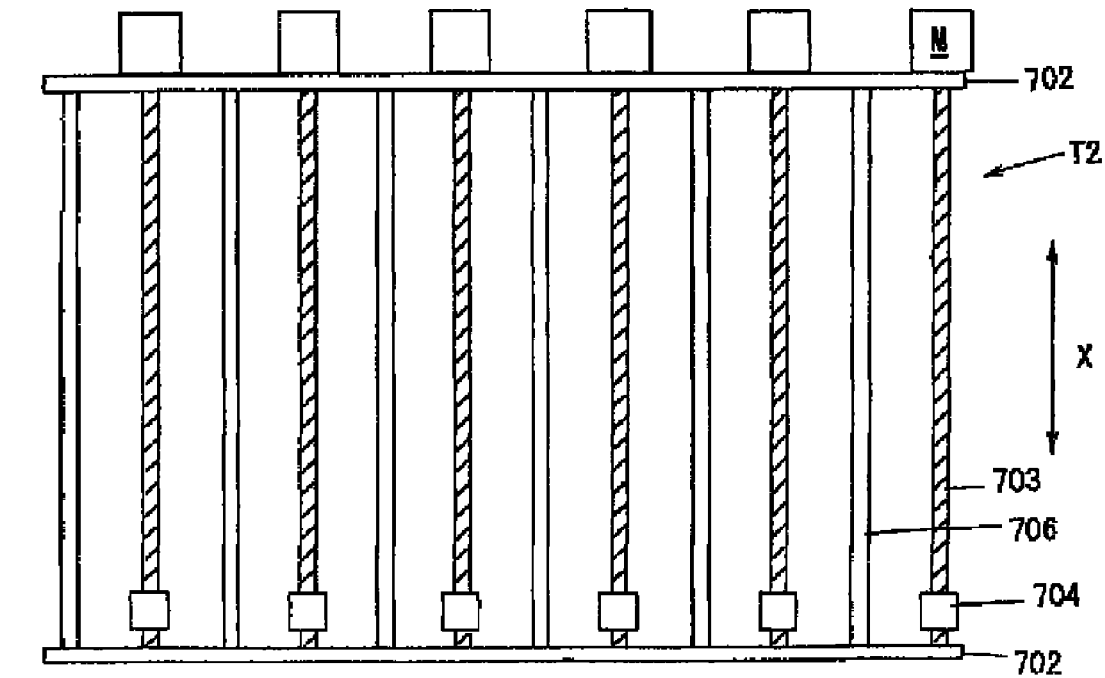
Fig.15

METHOD AND APPARATUS FOR MANUFACTURING THIN FILM PHOTOELECTRIC CONVERSION MODULE

This application is the U.S. national phase of International Application No. PCT/JP2008/063889, filed 1 Aug. 2008, which designated the U.S. and claims priority to Japanese Patent Application No. 2007-204426, filed Aug. 6, 2007, the entire contents of each of which are hereby incorporated by reference.

TECHNICAL FIELD

The present invention relates to a method and apparatus for manufacturing a thin film photoelectric conversion module, and more specifically, to a method and apparatus for manufacturing a thin film photoelectric conversion module in which reverse biasing is performed by applying a reverse bias voltage to thin film photoelectric conversion elements connected in series.

BACKGROUND ART

In recent years, thin film solar cells which are formed from gases as a raw material by a plasma CVD method receive attention. Examples of the thin film solar cells include silicon-based thin film solar cells made of a silicon-based thin film, CIS compound or CIGS compound thin film solar cells and the like, and development of these solar cells are accelerated and their quantities of production are increasingly enlarged.

These thin film solar cells are formed by laminating a transparent electrode, a photoelectric conversion layer, and a backside electrode on a substrate by a plasma CVD method, a sputtering method, or a vacuum evaporation method. In the thin film solar cell, since a layer thickness of the photoelectric conversion layer sandwiched between two electrodes is small, a pin hole produced in the photoelectric conversion layer readily causes short circuit between electrodes, thereby deteriorating power generation characteristics.

For the purpose of recovering such characteristics of a thin film solar cell, there is proposed a method and apparatus for performing reverse biasing in which short-circuit (pinhole) portions are dissipated to be removed or oxidized to be insulated through joule heat produced then by applying a reverse bias voltage between the electrodes of a solar cell.

For example, Patent Document 1 discloses a method and apparatus for removing short-circuit portions of a solar cell, in which with respect to a solar cell in which a plurality of strip-shaped solar cells formed by sequentially laminating a first electrode layer, a photoelectric conversion layer, and a second electrode layer on an insulating substrate are connected in series, short-circuit portions are removed by applying a voltage of a withstand voltage or less to both positive and negative electrode of the solar cell in a reverse direction. In this case, an applying member having a plurality of point-like, one or more linear, or one or more planar contact portions is brought into contact with a backside electrode of two solar cells adjacent to each other. Since a backside electrode of one solar cell is connected to a transparent electrode of the other solar cell, a voltage below a withstand voltage is applied in a reverse direction to the other solar cell.

It is described that in accordance with this method and, apparatus for removing short-circuit portions, setting and control of an applied voltage are easy and stable since by using an applying member formed of a plurality of probes, one or more linear, or one or more planar applying members, distances between the applying members and the short-circuit portions are reduced to decrease a voltage drops at the first electrode and at the second electrode, and therefore removal of the short-circuit portion can be ensured.

Patent Document 1: Japanese Unexamined Patent Publication No. 10-4202

DISCLOSURE OF THE INVENTION

Problems to be Solved by the Invention

However, in accordance with the above method and apparatus for removing short-circuit portions, when a plurality of short-circuit portions are present in a solar cell to which a reverse bias voltage is applied and in the short-circuit portions, a short-circuit portion, which has very low resistance and cannot be removed by applying a reverse bias voltage, is present, the following problems arise.

Specifically, there arises a problem that when a reverse bias voltage is applied to the solar cell, an electric current is concentrated in the short-circuit portion having very low resistance and other short-circuit portions having larger resistance than that of the short-circuit portion are not removed and remain despite the application of a reverse bias voltage. Further, since a strip-shaped solar cell has a broad area, it is difficult to identify a location of short-circuit and it takes much time to analyze defects.

Particularly, when solar cells are produced in quantity or when a solar cell is formed on a large sized substrate, such problems tend to arise. When solar cells are produced in quantity, a photoelectric conversion layer is continuously formed on a substrate, and in an apparatus for forming films, films or powder made of materials to configure photoelectric conversion layers are deposited. When such films or powder deposited in the apparatus for forming films adhere to a substrate before forming films, these substances adhering to the substrate are large compared with a film thickness of the photoelectric conversion layer, and therefore if the substances adhering are peeled off after forming the photoelectric conversion layers, relatively large defective portions (pinholes) are formed in the photoelectric conversion layer, and short-circuit portions having very small resistance are formed at the locations of defective portions. Also, when a solar cell is formed on a large substrate, a probability of producing the short-circuit portion having small resistance becomes high. Such short-circuit portions since electrodes on both sides of the photoelectric conversion layer are brought into direct contact with each other and a contact area of both electrodes is relatively large, and therefore it is often that sufficient joule heat cannot be obtained and the short-circuit portion cannot be removed even though the reverse bias voltage is applied to pass an electric current locally.

The present inventors have newly found that short-circuit portions having small resistance described above are produced in a development of a mass production technology of forming a thin film solar cell on a large sized substrate (for example, 1 m×1 m or larger), and made intensive technical development for the purpose of reducing an influence of the short-circuit portion on an overall output of a solar cell module, which resulted in the completion of the present invention.

Means for Solving the Problems

Thus, in accordance with the present invention, there is provided a method for manufacturing a thin film photoelectric conversion module, the method comprising the steps of: (A) forming a plurality of divided strings by dividing a string, in which thin film photoelectric conversion elements provided by sequentially laminating a first electrode layer, a photoelectric conversion layer and a second electrode layer on the surface of an insulating substrate are electrically connected in series, into a plurality of strings by dividing grooves, electrically insulating and separating the first electrode layer and the second electrode layer one from the other and extending in a serial connection direction; and (B) performing reverse biasing by applying a reverse bias voltage to each of thin film photoelectric conversion elements of the divided string.

Further, according to another aspect of the present invention, there is provided an apparatus for manufacturing a thin film photoelectric conversion module comprising: dividing means for dividing a string, in which thin film photoelectric conversion elements provided by sequentially laminating a first electrode layer, a photoelectric conversion layer and a second electrode layer on an insulating substrate are electrically connected in series, into a plurality of strings to form a plurality of divided strings; and reverse biasing means for performing reverse biasing by applying a reverse bias voltage to each thin film photoelectric conversion element of the divided string.

Effect of the Invention

In accordance with the present invention, since a string, in which thin film photoelectric conversion elements are connected in series, is divided into a plurality of strings to form a plurality of divided strings, an area, per one thin film photoelectric conversion element is decreased. As a result of this, a rate (probability) per one thin film photoelectric conversion element of the short-circuit portions having small resistance existing in the thin film photoelectric conversion element is decreased and a rate (probability) per one thin film photoelectric conversion element of the short-circuit portions having large resistance existing in the thin film photoelectric conversion element is increased.

Therefore, by performing reverse biasing of the thin film photoelectric conversion element in which its area is reduced, a short-circuit portion having large resistance in the thin film photoelectric conversion element can be readily removed with efficiency and an output of the thin film photoelectric conversion element module can be improved.

BRIEF DESCRIPTION OF THE DRAWINGS

FIG. 14 is a schematic configuration diagram showing a first example of a moving mechanism of the reverse biasing means of the seventh embodiment.

FIG. 15 is a schematic configuration diagram showing a second example of the moving mechanism of the reverse biasing means of the seventh embodiment.

Figure 1:
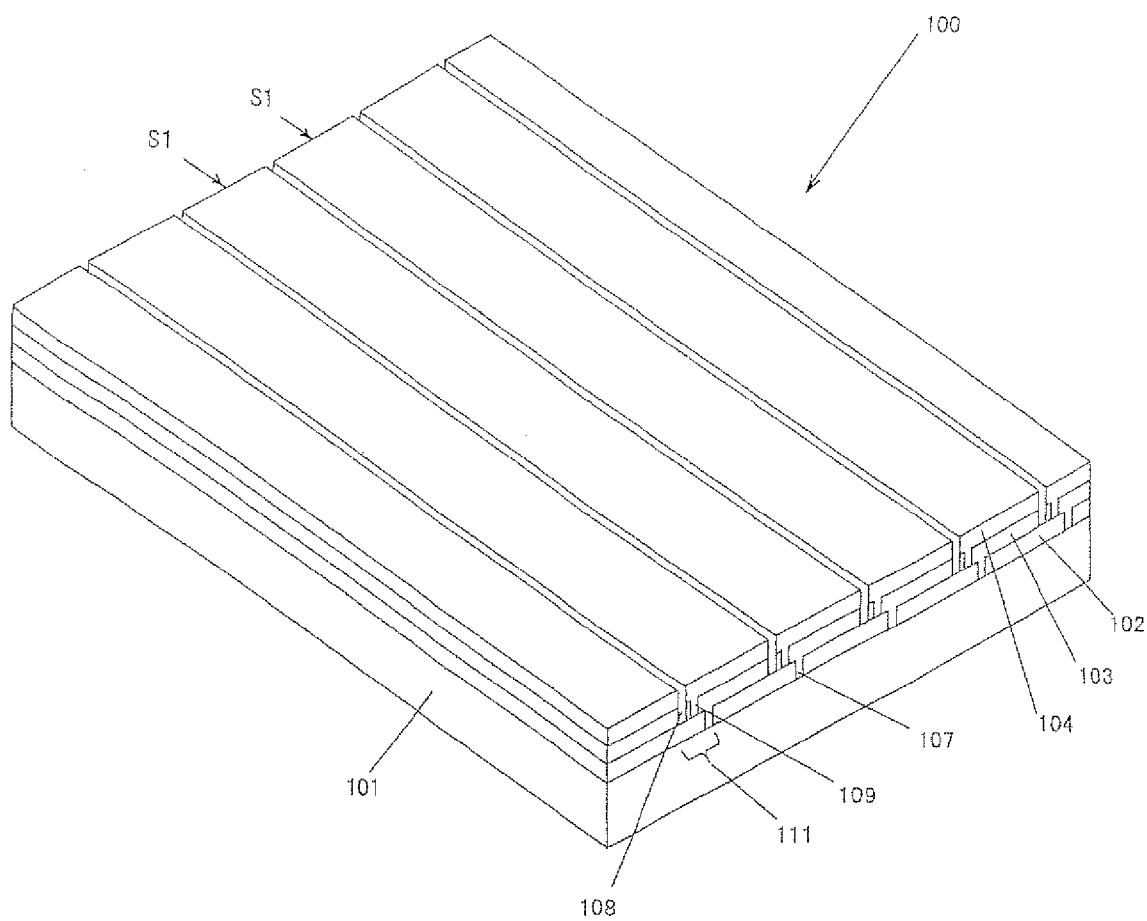
FIG. 1 is a schematic perspective view showing a first string and explaining a method for manufacturing a thin film photoelectric conversion module in accordance with a first embodiment of the present invention.

DESCRIPTION OF THE REFERENCE NUMERALS AND SYMBOLS 101 insulating substrate (transparent insulating substrate)
102 first electrode layer (transparent electrode layer)
103 photoelectric conversion layer
104 second electrode layer (backside electrode layer)
100 string (first string)
105 dividing groove
106a, 106b, 106c, 106d, 106e, 106f divided string
200 second string
501, 1501, 2501 output terminal
502, 1502, 2502 power source
505, 1505, 2505 conductive member
505a1, 505a2 electrode connection portion
601 up-and-down driving portion
602 holding portion
604 conductive plate material
512, 1512, 2512 reverse biasing means
1604 wiring (conductive plate material)
2109 switching circuit S1 strip-shaped cell (thin film photoelectric conversion element)
S2 unit cell
S3 cell
T, T1, T2, T3, T4 moving mechanism
U1, U2 voltage applying unit

BEST MODE FOR CARRYING OUT THE INVENTION

A method for manufacturing a thin film photoelectric conversion module of the present invention is characterized by comprising the steps of (A) forming a plurality of divided strings by dividing a string, in which thin film photoelectric conversion elements provided by sequentially laminating a first electrode layer, a photoelectric conversion layer and a second electrode layer on the surface of an insulating substrate are electrically connected in series, into a plurality of strings by dividing grooves, electrically insulating and separating the first electrode layer and the second electrode layer one from the other and extending in a serial connection direction, and (B) performing reverse biasing by applying a reverse bias voltage to each of thin film photoelectric conversion elements of the divided string.

Here, reverse biasing will be described.

By subjecting the thin film photoelectric conversion element to reverse biasing, it is possible to determine whether or not short-circuit portions are present in the biased portion and how the short-circuit portions are present.

In the case of applying a reverse bias voltage, a current is little passed when the short-circuit portion is not present, but a current is passed to remove the short-circuit portion when the short-circuit portion is present. However, when the short-circuit portion has very low resistance, heat generation is not sufficient even though an electric current flows and the short-circuit portion cannot be removed.

By measuring temporal changes of a current passed when applying the reverse bias voltage, short-circuit portions existing in the thin film photoelectric conversion element subjected to reverse biasing can be classified or a repair status of the short-circuit portion can be identified as follows.

(1) If a current passed in applying a reverse bias voltage of a certain value (for example, 5 V) is a specified value or less, a short-circuit portion is not present.

(2) When a current larger than a specified value is passed at the start of applying a reverse bias voltage of a certain value (for example, 5 V) and the current is gradually reduced and ultimately reaches below the specified value, it can be determined that the short-circuit portion is removed. Further, based on a current passed at the start of applying a reverse bias voltage, a resistance value of the short-circuit portion can be calculated and a degree of short circuit can be classified.

(3) When a current does not reaches below the specified value even when a reverse bias voltage of a certain value (for example, 5 V) is applied for a predetermine time (for example, several seconds), it can be determined that resistance of the short-circuit portion is small and the short-circuit portion cannot be removed.

In the present invention, measurement results described above can be acquired for every thin film photoelectric conversion element in the divided strings, and analysis of defects of a thin film photoelectric conversion module becomes easy.

The thin film photoelectric conversion module applied to the present invention is not particularly limited as long as it has a structure in which a plurality of thin film photoelectric conversion elements each formed by sequentially laminating a first electrode layer, a photoelectric conversion layer and a second electrode layer on an insulating substrate are integrated, and examples of the photoelectric conversion layer include a pn junction type, a pin junction type, a heterojunction type, a tandem structure type in which a plurality of pn junctions or pin junctions are overlaid, and the like. Further, the present invention can be applied to both of a thin film photoelectric conversion module of a superstrate type using a transparent substrate as an insulating substrate and a thin film photoelectric conversion module of a substrate type using an opaque substrate.

In the present invention, power sources varying from the divided string to the divided string may be used to simultaneously perform reverse biasing in the step (B). If doing so, since a plurality of divided strings are separated from one another by dividing grooves, the respective divided strings can be simultaneously subjected to reverse biasing separately without being affected by a potential imparted to electrodes of another divided string, and therefore a processing time of reverse biasing can be shortened. In addition, when a potential from the same power source is branched to the thin film photoelectric conversion elements of another divided string to perform the reverse biasing thereof, an effect of the present invention cannot be achieved since the reverse biasing of the respective thin film photoelectric conversion elements are performed in a state of being electrically connected in parallel.

Further, when a divided width (a length along a direction of dividing perpendicular to a direction of serial connection) of the divided string is short, the divided strings are divided into groups made of a plurality of divided strings, and reverse biasing of groups may be simultaneously performed using power sources varying by group. A potential from the same power source is branched and imparted to the divided strings in each group to perform reverse biasing, an effect of the present invention cannot be achieved between divided strings in each group. On the other hand, an effect of the present invention can be achieved between the divided strings of different groups whose reverse biasing are performed using different power sources.

Further, in the step (A), the dividing grooves may be formed so as to electrically connect the plurality of divided strings in parallel with one another. In this case, a plurality of dividing grooves are formed so as to leave a part of a first electrode/a second electrode of a string on the most upstream side in a serial direction and a part of a first electrode/a second electrode of a string on the most downstream side in a serial direction.

By doing so, a wiring work of connecting a plurality of divided strings in parallel with one another using a lead wire becomes easy in connecting an electrode-drawing out member to the thin film photoelectric conversion module and the wiring work can be conducted quickly.

Further, in the step (B), different potentials are simultaneously imparted to second electrode layers of at least three thin film photoelectric conversion elements in the same divided string, and thereby reverse biasing of at least two thin film photoelectric conversion elements of the three thin film photoelectric conversion elements may be simultaneously performed. By doing so, a reverse bias voltage can be simultaneously applied to two thin film photoelectric conversion elements to perform simultaneous reverse biasing of the two thin film photoelectric conversion elements, and a processing time can be shortened.

Further, in the step (B), different potentials are imparted to the second electrode layers of all thin film photoelectric conversion elements in the same divided string, and thereby reverse biasing of all thin film photoelectric conversion elements may be performed at once. By doing so, a reverse biasing time can be more shortened.

Herein, in the present invention, performing reverse biasing simultaneously or at once is not limited the case where reverse biasing of a plurality of thin film photoelectric conversion elements are started and ended at the same time, and includes the case where reverse biasing thereof are started at different times and the case where reverse biasing thereof are ended at different times. In other words, at given times, a reverse bias voltage may be applied to a plurality of thin film photoelectric conversion elements to perform reverse biasing.

Further, in the step (B) described above, the case where a potential is imparted to a plurality of second electrode layers opposite to the insulating substrate in performing the reverse biasing of a thin film photoelectric conversion element has been described, but since it is only necessary to impart different potentials to the first electrode layer and the second electrode layer of the thin film photoelectric conversion element during reverse biasing, a potential may be imparted to the first electrode layer when the first electrode layer of the thin film photoelectric conversion element is exposed.

Further, in the step (B), a reverse bias voltage applied to the thin film photoelectric conversion element may be a withstand voltage of the thin film photoelectric conversion element or less. The reverse bias voltage may be set, for example, at about 3 V, but it may be a reverse withstand voltage of the thin film photoelectric conversion element or less for preventing a junction portion such as pn junction, pin junction or the like in the thin film photoelectric conversion element from being destroyed and becoming a short-circuit state. The reverse withstand voltage of the thin film photoelectric conversion element varies depending on a structure such as a layer thickness of a photoelectric conversion layer or number of photoelectric conversion layers, and it is generally several volts to about 20 volts. Accordingly, while the reverse bias voltage differs depending on a structure such as a layer thickness of a photoelectric conversion layer or number of photoelectric conversion layers, it can be set at several volts to about 20 volts.

In the method for manufacturing a thin film photoelectric conversion module of the present invention, the following apparatus for manufacturing a thin film photoelectric conversion module can be used. Specifically, this apparatus for manufacturing a thin film photoelectric conversion module comprises dividing means for dividing a string, in which thin film photoelectric conversion elements provided by sequentially laminating a first electrode layer, a photoelectric conversion layer and a second electrode layer on an insulating substrate are electrically connected in series, into a plurality of strings to form a plurality of divided strings, and reverse biasing means for performing reverse biasing by applying a reverse bias voltage to each of thin film photoelectric conversion elements of the divided string.

The dividing means is not particularly limited as long as it is means capable of forming a dividing groove, which electrically insulates and separates the first electrode layer and the second electrode layer of the string one from the other and extends in a serial connection direction, and means including, for example, a YAG laser or a YVO$_4$ laser and an optional metal mask may be employed.

In accordance with these lasers, only the thin film photoelectric conversion elements can be easily divided with high accuracy without damaging the insulating substrate.

Further, as described above, the metal mask is used when the dividing grooves are formed so as to electrically connect the plurality of divided strings in parallel with one another. That is, by masking a part of the first electrode layer/second electrode layer at both ends of the string with a metal mask in forming a plurality of dividing grooves in a serial direction on each string by a laser, it is possible to form a plurality of divided strings electrically connected in parallel with one another since a masked area is not cut by a laser.

The reverse biasing means may have a configuration in which a power source, two or more conductive members which are electrically connected to the power source and brought into contact with the second electrode layers of at least two thin film photoelectric conversion elements in the same divided string to simultaneously impart different potentials to the second electrode layers, and two or more output terminals provide in the power source and imparting different potentials to the two or more conductive members to be brought into contact with the second electrode layers. In addition, the reverse biasing means will be described in detail in embodiments described later.

Hereinafter, an embodiment of the method for manufacturing a thin film photoelectric conversion module of the present invention will be described in detail in reference to drawings. In addition, the drawings and contents shown in the following description are just exemplifications and the scope of the present invention is not limited to these drawings and contents shown in the following description. Hereinafter, the present invention will be described by way of example with reference to the thin film photoelectric conversion module of a superstrate structure, but the following description basically holds true for the thin film photoelectric conversion module of a substrate structure. However, in the case of the substrate structure, the order of forming a first electrode, a photoelectric conversion layer and a second electrode is reversed, and a second electrode, a photoelectric conversion layer and a first electrode are formed on an insulating substrate in this order. In the case of the superstrate structure, a substrate side is a front side, and in the case of the substrate structure, the substrate side is a back side.

First Embodiment

FIG. 1 is a schematic perspective view showing a first string and explaining a method for manufacturing a thin film photoelectric conversion module in accordance with a first embodiment of the present invention.

The first string 100 has a configuration in which a plurality of strip-shaped thin film photoelectric conversion elements S1, formed by laminating a first electrode layer 102 as a transparent electrode layer, a photoelectric conversion layer 103 and a second electrode layer 104 as a backside electrode layer in this order on a transparent insulating substrate 101, are aligned in parallel and the plurality of strip-shaped thin film photoelectric conversion elements S1 are electrically connected in series. Hereinafter, the strip-shaped thin film photoelectric conversion element S1 is referred to as a strip-shaped cell S1.

A structure of the first string 100 will be specifically described. The transparent electrode layers 102 are separated from one another by first separating grooves 107 embedded in the photoelectric conversion layers 103, and the photoelectric conversion layers 103 and, the backside electrode layer 105 are separated from one another by second separating grooves 108. Further, by connecting the second electrode layer 104 of one strip-shaped cell S1 to the first electrode layer 102 of an adjacent another strip-shaped cell S1 through the contact line 109 being a portion where the photoelectric conversion layer 103 is removed by patterning using laser beam or the like, the plurality of strip-shaped cells S1 are electrically connected in series. In addition, in FIG. 1, a reference numeral 111 represents an integrated portion of thin film photoelectric conversion elements.

As a transparent insulating substrate 101, for example, a glass substrate, a polyimide or the like resin substrate, having heat resistance in the subsequent film forming process and transparency can be used. Further, the first electrode layer 102 is formed of a transparent conductive film, and preferably formed of a transparent conductive film made of a material containing $SnO_2$.

The material containing $SnO_2$ may be $SnO_2$ itself, or a mixture of $SnO_2$ and other oxide (for example, ITO which is a mixture of $SnO_2$ and $In_2O_3$).

A p-type semiconductor layer is doped with p-type impurity atoms such as boron, aluminum, or the like, and an n-type semiconductor layer is doped with n-type impurity atoms such as phosphorus, or the like. An i-type semiconductor layer may be a completely non-doped semiconductor layer, or may be a weak p-type or a weak n-type semiconductor layer containing a small amount of impurity and having a sufficient photoelectric conversion function. In addition, in the present specification, an "amorphous layer" and a "microcrystalline layer" refer to an amorphous semiconductor layer and a microcrystalline semiconductor layer, respectively.

A material of each semiconductor layer forming the photoelectric conversion layer is not particularly limited, and may be made of, for example, a silicon-based semiconductor, a CIS ($CuInSe_2$) compound semiconductor, a CIGS ($Cu(In, Ga)Se_2$) compound semiconductor. Hereinafter, description will be made in view of a case where each semiconductor layer is made of silicon-based semiconductor as an example. The term "silicon-based semiconductor" refers to amorphous or microcrystalline silicon, or semiconductors formed by doping amorphous or microcrystalline silicon with carbon, germanium or other impurities (silicon carbide, silicon-germanium, and the like). The term "microcrystalline silicon" refers to silicon in a mixed phase state of crystalline silicon having a small grain size (about several tens to thousand angstroms) and amorphous silicon. The microcrystalline silicon is formed, for example, when a crystal silicon thin film is prepared at low temperatures using a non-equilibrium process such as a plasma CVD method.

A configuration and materials of the second electrode layer 104 are not particularly limited, and the second electrode layer 104 as an example has a laminated structure in which a transparent conductive film and a metal film are laminated on a photoelectric conversion layer. The transparent conductive film is made of $SnO_2$, ITO, ZnO, or the like. The metal film is made of a metal such as silver, aluminum, or the like. The transparent conductive film and the metal film can be formed by a CVD, sputtering or vapor deposition method.

Next, the method for manufacturing a thin film photoelectric conversion module of the present invention will be described.

In this method for manufacturing a thin film photoelectric conversion module, first, a first string 100 shown in FIG. 1 is prepared in the following manner.

First, the first electrode layer 102 is laminated on the transparent insulating substrate 101 in a film thickness of about 500 to 1000 nm by a thermal CVD method, a sputtering method, or the like. Next, a part of the first electrode layer 102 is removed at a predetermined interval (about 7 to 18 mm) by a laser scribing method, to form a plurality of first separating grooves 107.

Subsequently, the photoelectric conversion layer 103 is laminated in a film thickness of about 300 to 3000 nm by a plasma CVD method or the like so as to cover the first electrode layers 102 separated by the first separating grooves 107. Examples of the photoelectric conversion layer 103 include a silicon-based semiconductor thin film, and the silicon-based semiconductor thin film is formed by sequentially laminating a p-type semiconductor layer, an i-type semiconductor layer and an n-type semiconductor layer on the first electrode 102.

Thereafter, a part of the photoelectric conversion layer 103 is removed at a predetermined interval (about 7 to 18 mm) by a laser scribing method, to form a plurality of contact lines 109.

Subsequently, a transparent conductive layer and a metal layer are laminated in this order by a sputtering method, a vapor deposition method or the like so as to cover the photoelectric conversion layer 103 to form the second electrode layer 104. Thereby, the contact lines 109 are embedded in the second electrode layer 104.

Next, a part of the photoelectric conversion layer 103 and the second electrode layer 104 is removed at a predetermined interval (about 7 to 18 mm) by a laser scribing method to separate these layers, to thereby form a plurality of second separating grooves 108.

In addition, a YAG laser or a $YVO_4$ laser, having a wavelength adjusted to be absorbed in a layer to be removed in forming each groove, can be used for the laser scribing method to form the first dividing grooves 107, the contact lines 109 and the second dividing grooves 108.

In this manner, the first string 100, in which the plurality of strip-shaped cells S1 are connected in series to one another on the transparent insulating substrate 101, is formed (see FIG. 1).

Figure 2:
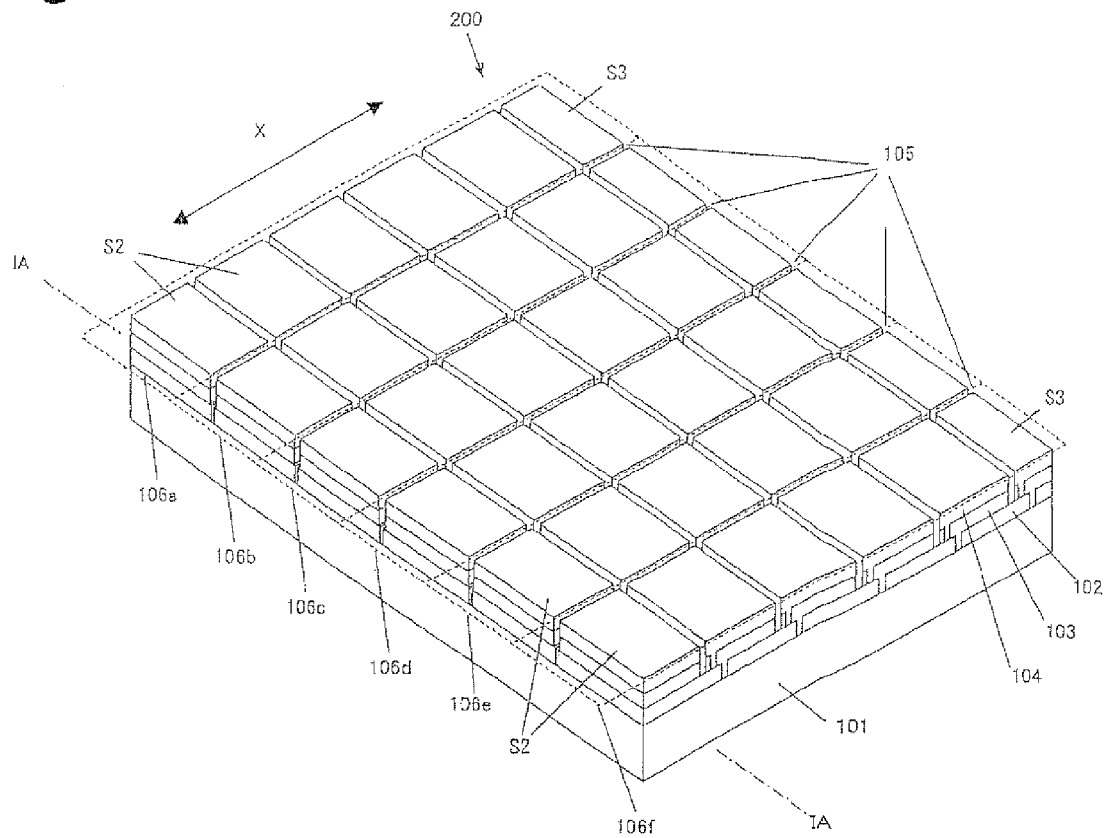
FIG. 2 is a schematic perspective view showing a second string and explaining the manufacturing method of the thin film photoelectric conversion module of the first embodiment of the present invention.
Figure 3:
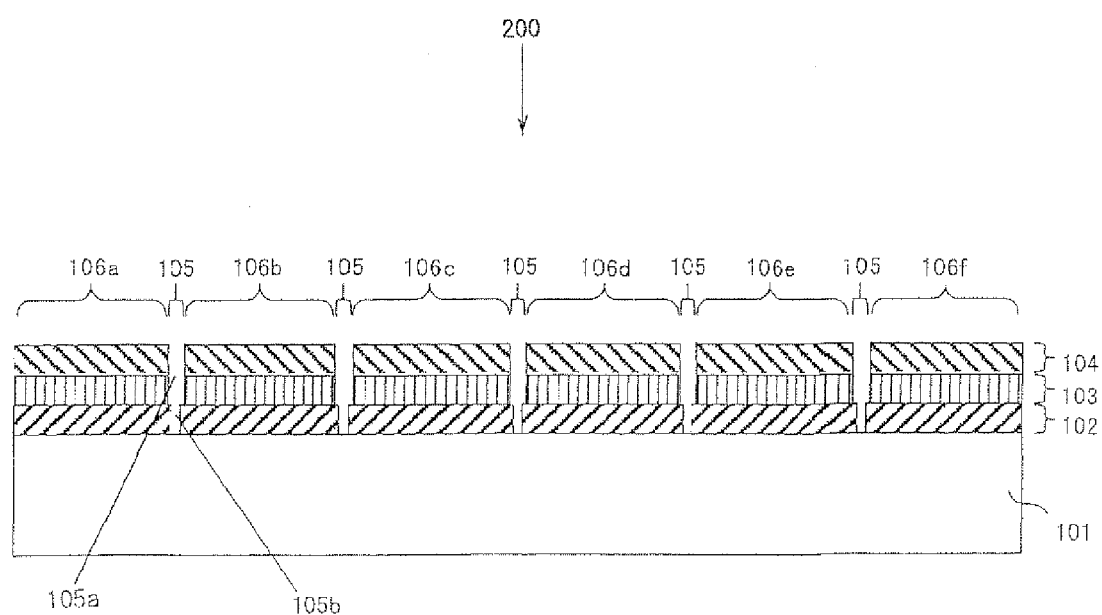
FIG. 3 is a schematic cross-sectional view taken along the line IA-IA shown in FIG. 2.

Next, a second string, which has divided strings 106a to 106f formed by diving each of the strip-shaped cells S1 in the first string 100 into a plurality of strings as shown in FIGS. 2 and 3, is prepared. The second string 200 becomes an object of reverse biasing described later. In addition, FIG. 2 is a schematic perspective view showing a second string and explaining the manufacturing method of the thin film photoelectric conversion module of the first embodiment of the present invention, and FIG. 3 is a schematic cross-sectional view taken along the line IA-IA shown in FIG. 2.

First, a part of the photoelectric conversion layer 103 and the second electrode layer 104 is removed at a predetermined interval (about 75 to 250 mm) by a laser scribing method in which a laser beam is traveled in an X-direction (direction orthogonal to a longitudinal direction of the strip-shaped cell S1) while irradiating the laser beam from a transparent insulating substrate 101 side, to form a first dividing groove 105a. As the laser beam irradiated, second higher harmonics (wavelength: 532 nm) of a YAG laser, which is little absorbed in the first electrode layer (transparent electrode layer) 102, can be employed.

Next, the first electrode layer 102 is removed by traveling the laser beam in an X-direction along a central portion of the first dividing groove 105a while irradiating the laser beam from the transparent insulating substrate 101 side to form a second dividing groove 105b. As the laser beam irradiated, a fundamental wave (wavelength: 1.06 μm) of a YAG laser, which is absorbed in the first electrode layer 102, can be employed.

By thus forming the dividing groove 105 made of the first dividing groove 105a and the second dividing groove 105b, each of strip-shaped cells S1 (see FIG. 1) is divided into a plurality of strings and the plurality of strings are electrically insulated, and thereby, it is possible to prepare the second string 200 having the plurality of divided strings 106a to 106f in parallel, in which a plurality of unit cells S2 are electrically connected in series in an X-direction. In FIG. 2, a plurality of elongate rectangular regions boxed with a dotted line represent the divided strings.

In addition, as shown in FIG. 2, a cell S3 on an end side in an X-direction of the divided strings is formed in a state in which dimensions in an X-direction of the cells S3 are shorter than those of other unit cells S2, and these cells S3 are not used as a photoelectric conversion layer but second electrodes 104 of the cells S are used as an electrode at the time of reverse biasing described later.

Although FIG. 2 shows the second string 200 formed by electrically insulating and aligning the plurality of divided strings 106a to 106f by the dividing groove 105, a second string formed by electrically connecting the divided strings 106a to 106f in parallel with one another may be formed (not shown). In this case, prior to irradiation of laser beam from the transparent insulating substrate 1 side, a metal mask is located on an outer surface of the transparent insulating substrate 101 positioned in the back of end edges extending in a longitudinal direction of the second electrodes 104 in two strip-shaped cells S1 on both end sides in a serial direction of the string 100 shown in FIG. 1. Then, by irradiating the laser beam from the transparent insulating substrate 101 side, as described above, with the metal mask being placed, the first dividing groove 105a and the second dividing groove 105b are formed to form a dividing groove 105. Since the laser beam is not allowed to pass through the metal mask, a first electrode 102, a photoelectric conversion layer 103 and a second electrode 104 under an area covered with the metal mask remain. As the metal mask, a metal sheet of 1 to 3 mm in thickness made of aluminum, stainless steel or the like can be used.

Thereby, the first electrode 102 and the second electrode 104 of the unit cells S2 on one end side in a serial direction of the plurality of divided strings 106a to 106f are connected in parallel with one another by a common electrode, and the first electrode 102 and the second electrode 104 of the cell S3 on the other end side in the serial direction of the plurality of divided strings 106a to 106f are connected in parallel with one another by a common electrode.

In the method for manufacturing a thin film photoelectric conversion module of the present invention, next, a step of performing reverse biasing by applying a reverse bias voltage to the unit cells S2 of the second string 200 is carried out. When a short-circuit portion, which is produced by the contact of the first electrode 102 with the second electrode 104 through a pinhole formed in the photoelectric conversion layer 103 in the unit cells S, is present, by this reverse biasing, the short-circuit portion can be removed and the short-circuit portions can be classified and a repair status of the short-circuit portion can be identified.

Figure 4:
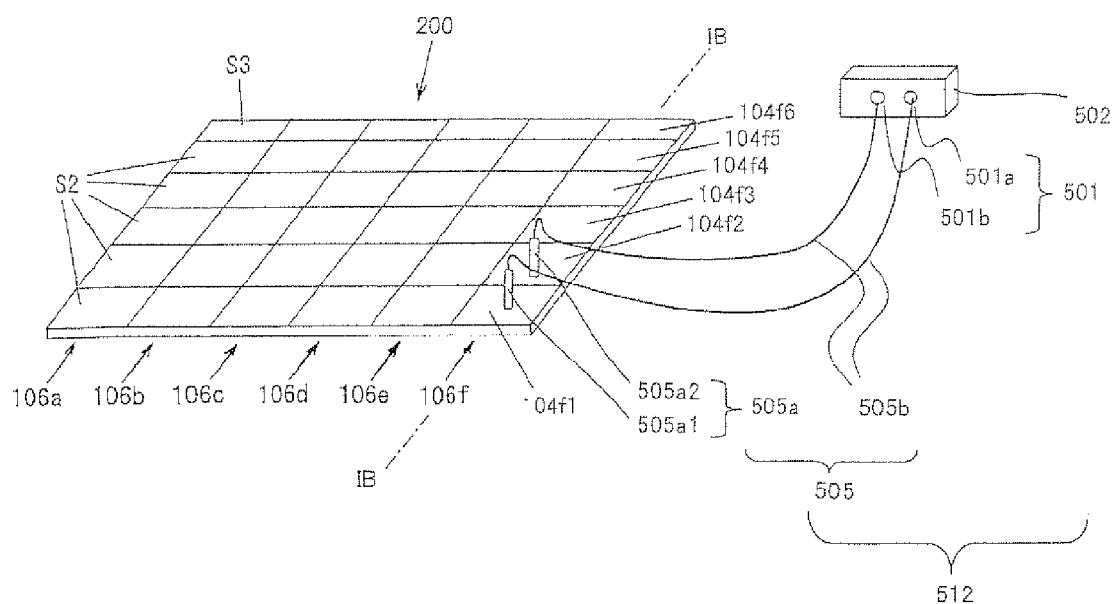
FIG. 4 is a schematic view explaining a step of reverse biasing and reverse biasing means used in this step in accordance with the first embodiment.

FIG. 4 is a schematic view explaining a step of reverse biasing and reverse biasing means used in this step in accordance with the first embodiment.

The reverse biasing means 512 includes a power source 502 having an output terminal 501 to output a fixed voltage and a conductive member 505 which connects the output terminal 501 to each second electrode layer of the second string 200.

The output terminal 501 is made of a pair of output terminals 501a and 501b, and is constructed so as to output a positive potential to one output terminal 501a and a potential of 0 V to the other output terminal 501b in the first embodiment. The positive potential output to the output terminal 501a can be controlled to keep any value. The conductive member 505 is made of an electrode connection portion 505a and a wiring portion 505b.

In addition, a specific configuration of reverse biasing means which is usable in the reverse biasing step in the first embodiment will be described with reference to a seventh embodiment and an eighth embodiment, which will be described later.

Figure 5:
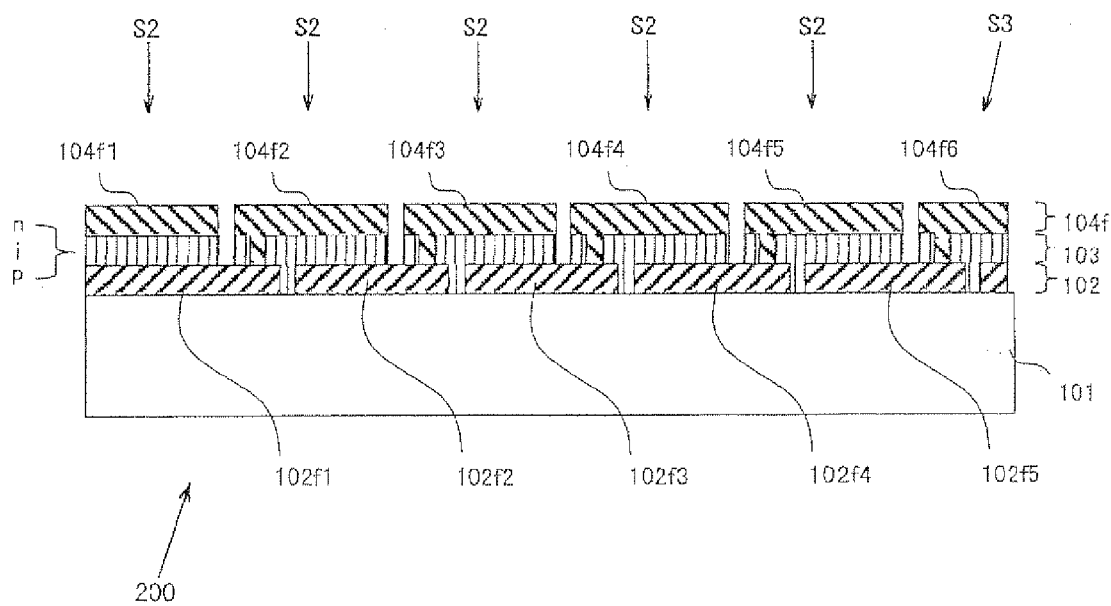
FIG. 5 is a schematic cross-sectional view showing the second string taken along the line IB-IB shown in FIG. 4.

FIG. 5 is a schematic cross-sectional view showing the second string taken along the line IB-IB shown in FIG. 4. Specifically, FIG. 5 is a sectional view in cutting a divided string 106f in an X-direction in the second string 200 shown in FIGS. 2 and 3, and first electrodes in unit cells S2 and a cell S3 of the divided string 106f are denoted by 102/1 to 102/5, and second electrodes thereof are denoted by 104/1 to 104/6.

In the reverse biasing step, as shown in FIG. 4, first, a pair of electrode connection portions 505a1 and 505a2 of the reverse biasing means are brought into contact with second electrode layers 104/1 and 104/2 adjacent to each other at the end portion in the front divided string 106f (see FIG. 2), for example. A second electrode layer 104/1 of one unit cell S2 is a backside electrode on an n-type semiconductor layer side of the photoelectric conversion layer 103. Further, The second electrode layer 104/2 of the other unit cell S2 is connected to the first electrode layer 102/1 which is a transparent electrode layer on an p-type semiconductor layer side of the photoelectric conversion layer 103 in one unit cell S2. Therefore, if imparting a positive potential to one second electrode layer 104/1 and imparting 0 V to the other second electrode layer 104/2, a reverse voltage is applied to the photoelectric conversion layer 103 of one unit cells S2 and reverse biasing is performed.

Specifically, for example, a potential of +3V is output to the output terminal 501a, a potential of 0V is output to the output terminal 501b, and a voltage of 3V is applied for 1 second between the second electrode layers 104/1 and 104/2. Thereby, a backward voltage (reverse bias voltage) of 3 V is applied to the photoelectric conversion layer 103 for 1 second.

When a current is little passed by applying this voltage, it is determined that the short-circuit portion is not present in the unit cells S2, and reverse biasing is terminated, and the pair of electrode connection portions 505a1 and 505a2 are brought into contact with second electrode layers 104/2 and 104/3 at a position moved by one to perform reverse biasing of a next unit cell S2.

On the other hand, when a current larger than a predetermine value is passed in applying a voltage and the current is not decreased during a duration of voltage application within 1 second, a potential of the output terminal 101a is changed, to 5V and a reverse bias voltage is further applied for 1 second. When still, the current is not reduced, it is determined that reverse biasing cannot be performed, and the reverse biasing is terminated and reverse biasing of a next unit cell S2 is performed. Here, if a potential output to the output terminal 501a is too large, a pin junction of the unit cell S2 is destroyed, and therefore a voltage applied to the unit cell S2 have to be a withstand voltage or less.

Reverse biasing of all unit cells S2 of one row of divided string 106f (see FIG. 2) are sequentially performed according to the above-mentioned procedure. In addition, since the cell S3 in a portion of the second electrode 104/6 with which the output terminal 505a2 is last brought into contact is not used as a photoelectric conversion element, the reverse biasing of the cell S3 is not omitted.

Further, after reverse biasing of all unit cells S2 of one row of divided string 106f is completed, by following the same procedure, reverse biasing of all unit cells S2 of an adjacent next divided string 106e are sequentially performed and reverse biasing of all unit cells S2 in the second string 200 are thus performed.

Based on data thus acquired at the time of reverse biasing of the unit cells S2, a degree of short circuit can be classified and locations at which short-circuit portions tend to be produced can be readily analyzed. Feedback of this analyzed result can be utilized for an improvement of a film forming step of the photoelectric conversion layer.

Further, in the conventional method, it is difficult to identify a location and a repair status of the short-circuit portion of the thin film photoelectric conversion element, but by performing the reverse biasing of a thin film photoelectric conversion element of small area in the divided string, a short-circuit location can be narrow down to smaller area, and analysis of defects that locations at which defects tend to be produced are identified becomes easy. Therefore, it becomes easy to take in problems on manufacturing apparatus side and early response becomes possible.

Further, in an integrated thin film solar cell module, when a part of thin film photoelectric conversion elements connected in series stops power generation due to projection, a voltage generated in other thin film photoelectric conversion element is applied to the thin film photoelectric conversion element, which has stopped power generation in shade, in the reverse direction of a pn junction. When a short-circuit portion is present in the thin film photoelectric conversion element to which a backward voltage is applied, since an electric current is concentrated in the short-circuit portion and heat is generated by joule heat to locally raise a temperature of the element, there is a possibility that the so-called "hot-spot phenomenon", in which peeling of a film occurs between an electrode and a photoelectric conversion layer or a substrate splits off, may occur. In accordance with the present invention, an incidence of the "hot-spot phenomenon" can be reduced since the short-circuit portion can be removed with efficiency.

Hereinafter, description will be given of the second to sixth embodiments, in each of which the second string 200 is prepared in the same manner as in the first embodiment and a step of reverse biasing is performed by a method different from the reverse biasing method of the first embodiment. In the second to sixth embodiments, description of up to manufacturing of the second string 200 will be omitted, and a reverse biasing step will be predominantly described. In addition, in the first embodiment, the case where five unit cells S2 and one cell S3 are connected in series to one another to form one divided string is exemplified, but in the first to sixth embodiments, design change of number of unit cells S2 in one divided string can be freely performed.

Second Embodiment

Figure 6:
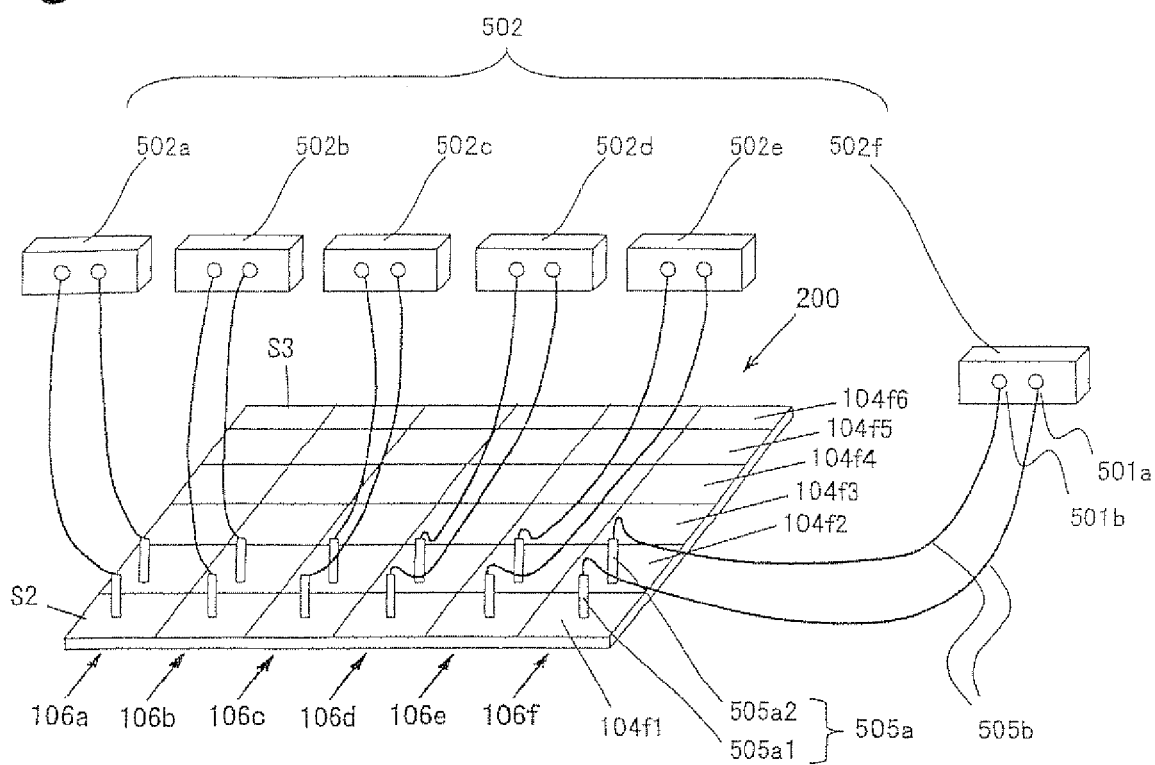
FIG. 6 is a schematic view explaining a method for manufacturing a thin film photoelectric conversion module, a step of reverse biasing, and reverse biasing means used in this step, in accordance with a second embodiment of the present invention.

FIG. 6 is a schematic view explaining a method for manufacturing a thin film photoelectric conversion module, a step of reverse biasing, and reverse biasing means used in this step, in accordance with a second embodiment of the present invention.

In the second embodiment, using different power sources 502a to 502f for each of divided strings, unit cells S2 in each divided string are sequentially subjected to reverse biasing. In other words, the reverse biasing means of the second embodiment includes a plurality of reverse biasing means of the first embodiment described in FIG. 4.

Accordingly, in the step of reverse biasing of the second embodiment, unit cells S2 of the respective divided strings can be simultaneously subjected to reverse biasing and thereby the reverse biasing time of the second string 200 can be more shortened. In addition, the procedure of sequentially subjecting the unit cells in the divided string to reverse biasing is similar to that of the first embodiment.

In this case, since the divided strings are electrically separated from one another by dividing grooves 105 (see FIG. 3), reverse biasing of the respective divided strings can be separately performed without being affected by a potential imparted to second electrodes of other divided strings. Further, even though the divided strings are electrically connected in parallel, each divided string is not affected by a potential imparted to second electrodes of other divided strings.

Further, even though one (for example, negative terminals) of positive terminals or negative terminals of a plurality of power sources are short-circuited (by use of a common wiring) to become the same potential, reverse biasing of the respective divided strings can be separately performed without being affected by a voltage imparted to other divided strings if the other terminals (for example, positive terminals) are not short-circuited.

Third Embodiment

Figure 7:
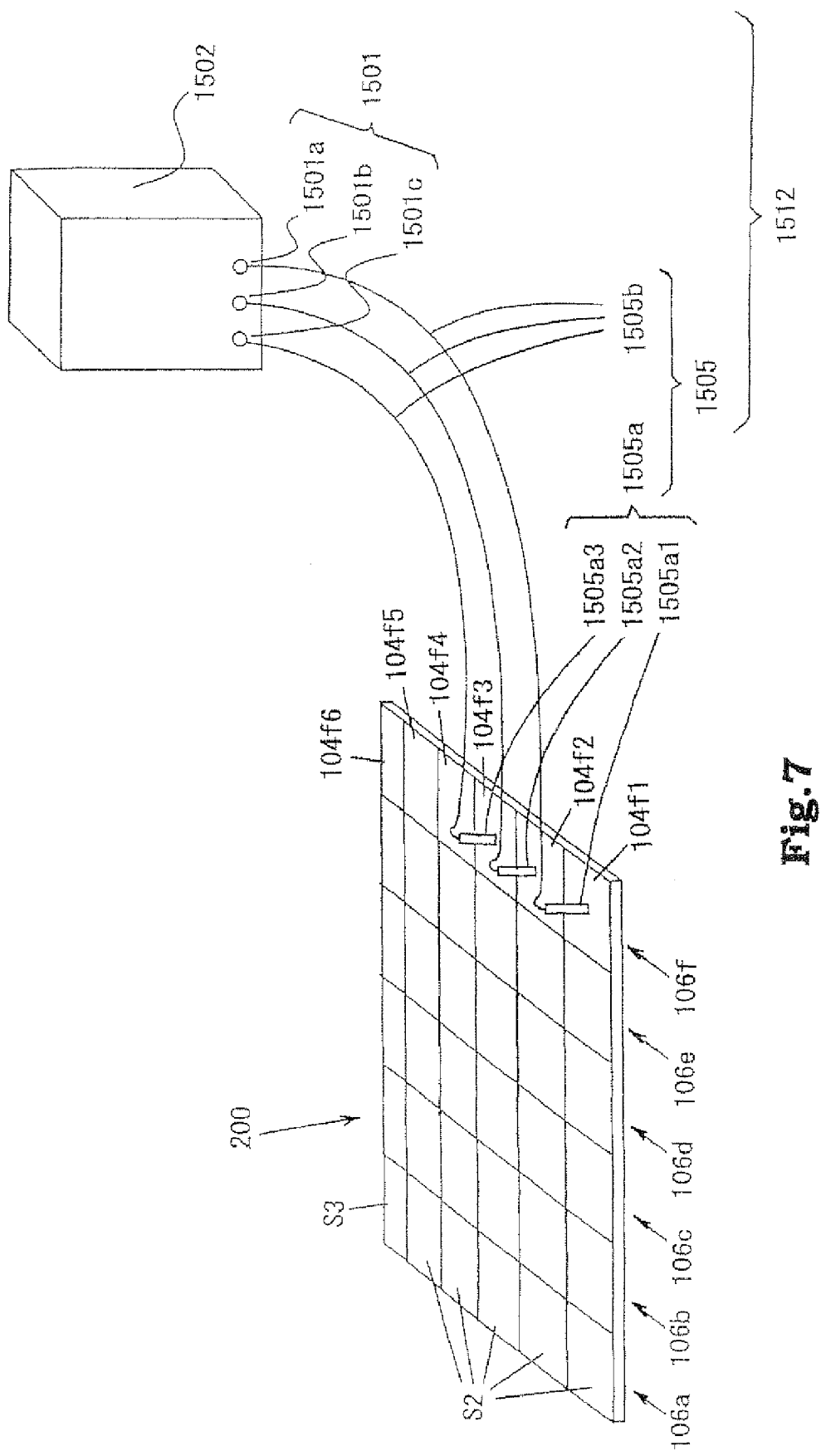
FIG. 7 is a schematic view explaining a method for manufacturing a thin film photoelectric conversion module, a step of reverse biasing, and reverse biasing means used in this step, in accordance with a third embodiment of the present invention.
Figure 8:
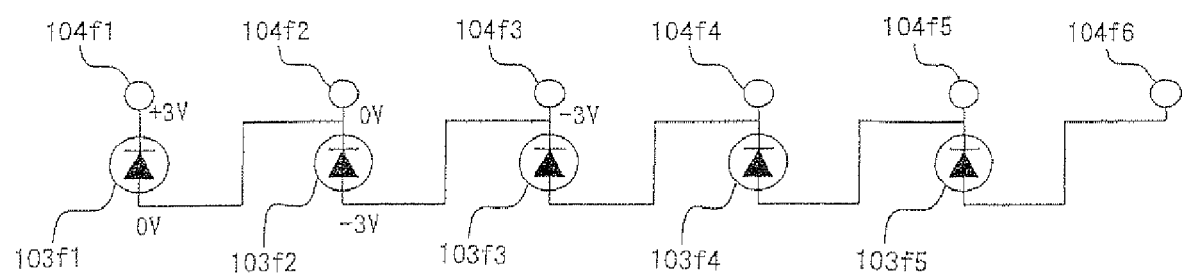
FIG. 8 is a diagram showing an equivalent circuit of one divided string connected in series in accordance with the third embodiment.

FIG. 7 is a schematic view explaining a method for manufacturing a thin film photoelectric conversion module, a step of reverse biasing, and reverse biasing means used in this step, in accordance with a third embodiment of the present invention. Further, FIG. 8 is a diagram showing an equivalent circuit of one divided string connected in series in accordance with the third embodiment. A second string 200 in FIG. 7 is similar to those in the first embodiment of FIG. 4 and the second embodiment of FIG. 6, and components in FIG. 7 similar to those described in FIGS. 4 and 6 are denoted by the same symbols. Further, an equivalent circuit in FIG. 8 is an equivalent circuit of a divided string 106f, and symbols 103/1 to 103/6 represent photoelectric conversion layers of the unit cells S2 connected in series.

In the third embodiment, in a step of reverse biasing, different potentials are simultaneously imparted to second electrodes of at least three unit cells S2 in the same divided string, and thereby reverse biasing of at least two unit cells S2 of the at least three unit cells S2 are simultaneously performed.

The reverse biasing means 1512 of the third embodiment simultaneously imparts three different voltages to the second electrodes 104 of three unit cells S2, and includes a power source 1502 having three output terminals 1501 to simultaneously output three different potentials, and a conductive member 105 which connects the three output terminals 1501 to second electrodes 104 of the three unit cells S2 connected in series. The conductive member 105 is made of an electrode connection portion 105a and wiring portion 105b.

Each of the output terminals 101 may outputs different potentials, and in the present third embodiment, for example, an a potential of +3V can be output to an output terminal 101a, a potential of 0V can be output to an output terminal 101b, and a potential of −3V can be output to an output terminal 101.c.

By the reverse biasing means 1512, a reverse bias voltage of 3V can be simultaneously applied to two unit cells S2 to simultaneously perform reverse biasing of the two unit cells S2.

In the present third embodiment, a voltage of 3V is adopted as a reverse bias voltage, but the reverse bias voltage may be a withstand voltage of the unit cells S2 or less for preventing a pin junction of the unit cells S2 from being destroyed and becoming a short-circuit state. The withstand voltage of the unit cells S2 varies depending on a structure such as a layer thickness of a photoelectric conversion layer or number of photoelectric conversion layers, but since it is generally several volts to about twenty volts, the reverse bias voltage can be set at a value within this range.

Next, the step of reverse biasing, in which the reverse biasing means of the third embodiment is used, will be described with reference to FIGS. 7 and 8.

When first, electrode connection portions 1505a1, 1505a2 and 1505a3 are brought into contact with second electrode layers 104/1, 104/2 and 104/3, respectively, and for example, a potential of +3V is output to an output terminal 1501a1, a potential of 0V is output to an output terminal 1501b and a potential of −3V is output to an output terminal 1501c, potentials of +3V, 0V and −3V are imparted to the second electrode layers 104/1, 104/2 and 104/3, respectively, as shown in FIG. 8. Thereby, a reverse bias voltage of 3V is simultaneously applied to the photoelectric conversion layer 103/1 and the photoelectric conversion layer 103/2 to perform simultaneous reverse biasing of these photoelectric conversion layers. In doing so, a voltage from a remaining photoelectric conversion layer 103/3 of three photoelectric conversion layers is not applied to other adjacent photoelectric conversion layer 103/4 and a problem that the photoelectric conversion layer operates in a forward direction as a transistor does not arise.

After the completion of the reverse biasing of the photoelectric conversion layer 103/1 and the photoelectric conversion layer 103/2, the electrode connection portions 1505a1, 1505a2 and 1505a3 are brought into contact with second electrode layers 104/3, 104/4 and 104/5, respectively, and a potential of +3V is output to an output terminal 1501a1, a potential of 0V is output to an output terminal 1501b and a potential of −3V is output to an output terminal 1501c. Thereby, a reverse bias voltage of 3V is simultaneously applied to the photoelectric conversion layer 103/3 and the photoelectric conversion element 103/4 to perform simultaneous reverse biasing of these photoelectric conversion elements.

Thus, reverse biasing of two photoelectric conversion layers adjacent to each other can be simultaneously performed, and thereafter, when one photoelectric conversion layer to be subjected to reverse biasing remains, specifically, reverse biasing of the photoelectric conversion layer 103/5 shown in FIG. 8 is performed, the electrode connection portion 1505a1 is brought into contact with the second electrode layer 104/5 of the photoelectric conversion layer 103/5 and the electrode connection portion 1505a2 is brought into contact with the adjacent second electrode layer 104/6, and a potential of +3V is output to the output terminal 1501a1 and a potential of 0V is output to the output terminal 1501b. Alternatively, the electrode connection portion 1505a2 is brought into contact with the second electrode layer 104/5 of the photoelectric conversion layer 103/5 and the electrode connection portion 1505a3 is brought into contact with the adjacent second electrode layer 104/6, and a potential of 0V is output to the output terminal 1501b and a potential of −3V is output to the output terminal 1501c.

After reverse biasing of all unit cells S2 of one row of divided string 106f is thus completed, as described above, by following the same procedure, reverse biasing of all unit cells S2 of an adjacent next divided string 106e are sequentially performed and reverse biasing of all unit cells S2 in the second string 200 are performed.

In accordance with the third embodiment, a reverse biasing step can be completed in a shorter time than that of the first embodiment.

Fourth Embodiment

In a fourth embodiment, in the step (B) of performing reverse biasing, reverse biasing of all thin film photoelectric conversion elements are performed at once by imparting different potentials to the second electrode layers of all thin film photoelectric conversion elements in the same divided string.

Specifically, in the third embodiment, number of levels of output potential from the power source 1502, output terminals 1501 and conductive members 1505 is set at three, but when the number of the unit cells S2 connected in series in one divided string is large, a processing time of a reverse biasing step can be more shortened by increasing the number of levels of output potential, output terminals and conductive members. Furthermore, it is also possible to perform reverse biasing of all unit cells S2 at once by providing output potentials, output terminals and conductive members corresponding to all of second electrode layers of unit cells S2.

The fourth embodiment is an application of the third embodiment, and for example when one divided string has five photoelectric conversion layers 103/1 to 103/5 connected in series as shown in FIG. 8, in order to perform simultaneous reverse biasing of these five photoelectric conversion layers 103/1 to 103/5, reverse biasing of all of photoelectric conversion layers 103/1 to 103/5 in one divided string can be performed by simultaneously applying, for example, voltages (withstand voltage of the photoelectric conversion layer or less) of +9 V, +6 V, +3 V, 0 V, −3 V and −6 V so that potentials of the second electrodes 104/1 to 104/6 are lowered in this order.

Fifth Embodiment

In a fifth embodiment, a reverse biasing method similar to that in the third embodiment is employed, but means 2512 for reverse biasing different from the means 1512 for reverse biasing of the third embodiment is used to perform a step of reverse biasing of the second string 200. Figure is a schematic view explaining a method for manufacturing a thin film photoelectric conversion module, a step of reverse biasing, and reverse biasing means used in this step, in accordance with a fifth embodiment of the present invention.

The reverse biasing means 2512 has a power source having three output terminals to output different potentials, and four or more conductive members, and the reverse biasing means 2512 further includes a switching circuit to switch a circuit so as to electrically connect any three conductive members of the four or more conductive members to the three output terminals.

Figure 9:
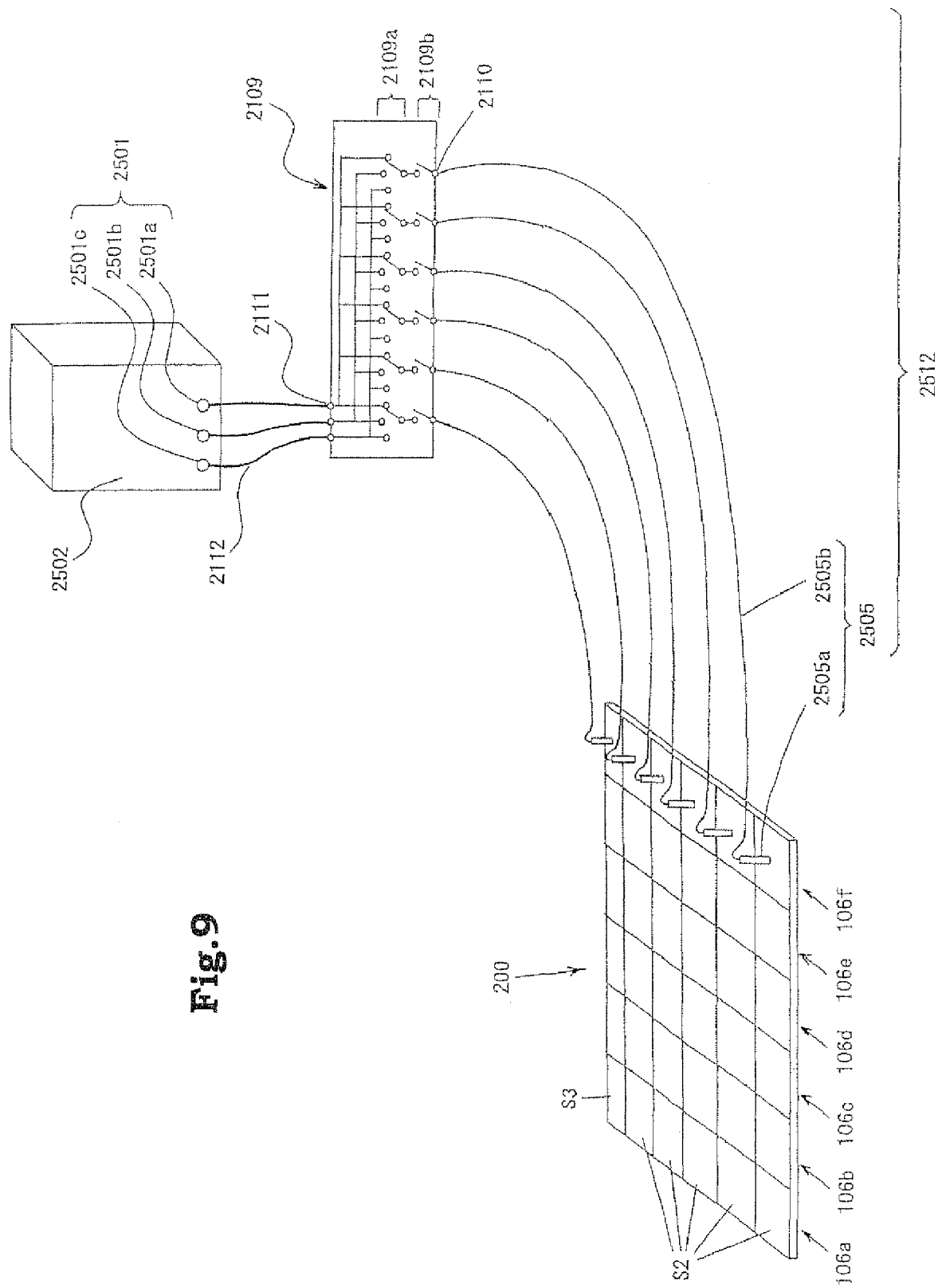
FIG. 9 is a schematic view explaining a method for manufacturing a thin film photoelectric conversion module, a step of reverse biasing, and reverse biasing means used in this step, in accordance with a fifth embodiment of the present invention.

Specifically, for example, potentials of +3V, 0V and −3V are output to three output terminals 2501a, 2501b and 2501c, respectively, as shown in FIG. 9. Further, the reverse biasing means 2512 includes six conductive members 2505 made of an electrode connection portion 2505a and a wiring portion 2505b. Furthermore, the reverse biasing means 2512 includes a switching circuit 2109 to switch a circuit so as to electrically connect three output terminals 2501a, 2501b and 2501c to any three conductive members of the six conductive members 2505.

The switching circuit 2109 includes three input terminals 2111 which are connected to the three output terminals 2501a, 2501b and 2501c through wirings 2112, six output terminals 2110 which are connected to the six wiring portions 2505b of the conductive members 2505, a switching portion 2109a to switch a circuit so as to electrically connect (turn ON) the three output terminals 2501a, 2501b and 2501c to any three output terminals of the six output terminals 2110, and switch portions 2109b corresponding to the respective output terminals 2110.

When the means 2512 for reverse biasing is used to perform reverse biasing of the second string 200, as shown in FIG. 9, first, all electrode connection portions 2505a are brought into contact with all of second electrodes 104/1 to 140/6 in one divided string 106f. When voltages of +3 V, 0 V and −3 V are applied to the second electrodes 104/1, 104/2 and 140/3, a switching portion 2109a, is actuated to switch the output terminal 2110 corresponding to the second electrode 104/1 and the output terminal 2501a (+3V) of the power source 2502 to a state of being connected to each other, switch the output terminal 2110 corresponding to the second electrode 104/2 and the output terminal 2501b (0V) of the power source 2502 to a state of being connected to each other, and switch the output terminal 2110 corresponding to the second electrode 104/3 and the output terminal 2501c (−3V) of the power source 2502 to a state of being connected to each other, and a switch portion 2109b of the output terminal 2110 corresponding to the second electrodes 104/1, 104/2, 140/3 is turned on.

Thereby, as with the third embodiment, a reverse bias voltage of 3V is applied to two photoelectric conversion layers corresponding to the second electrodes 104/1 and 104/2 to perform reverse biasing of these photoelectric conversion layers. In next reverse biasing, the switching portion 2109a and the switch portion 2109b are appropriately switched so as to apply a reverse bias voltage of 3V to two photoelectric conversion layers corresponding to the second electrodes 104/3 and 104/4, and the reverse biasing of a photoelectric conversion layer is performed in this manner repeatedly up to the last photoelectric conversion layer. In addition, when one photoelectric conversion layer to be subjected to reverse biasing remains, the switching portion 2109a and the switch portion 2109b may be appropriately switched so as to impart a potential of +3V or 0V to the second electrodes 104/5 of the remaining photoelectric conversion layer and impart a potential of 0 V or −3V to the second electrodes 104/6 of an end portion.

After reverse biasing of one divided string is thus completed, reverse biasing of divided strings not subjected to reverse biasing are sequentially performed.

In accordance with the fifth embodiment, as with the third embodiment, a reverse bias voltage can be simultaneously applied to any two photoelectric conversion elements selected by the switching circuit 2109 and reverse biasing of the two photoelectric conversion elements can be simultaneously performed. Further, when the photoelectric conversion element to be subjected to reverse biasing is selected, it is not necessary to relatively move a position of the electrode connection portion 2505a and the photoelectric conversion layer and a moving means for moving relatively becomes unnecessary.

Sixth Embodiment

Figure 10:
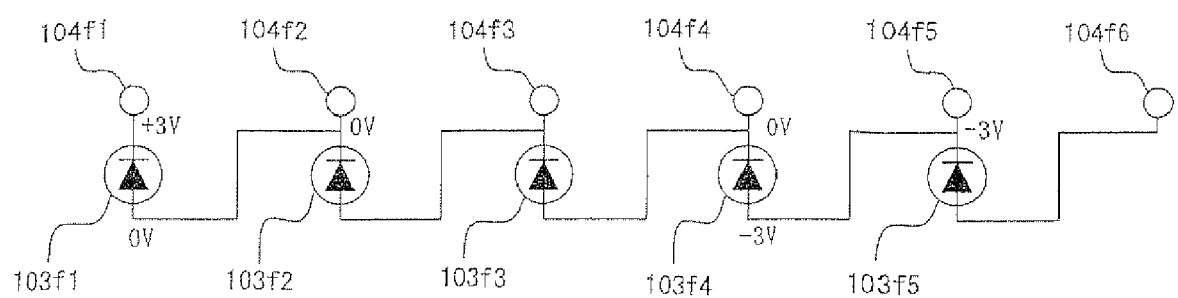
FIG. 10 is a diagram showing an equivalent circuit of photoelectric conversion layers connected in series and explaining a reverse biasing method, in accordance with a sixth embodiment of the present invention.

A reverse biasing method of a sixth embodiment is a method for simultaneously performing reverse biasing of a plurality of photoelectric conversion elements which are not adjacent to each other. FIG. 10 is a diagram showing an equivalent circuit of photoelectric conversion layers connected in series and explaining a reverse biasing method, in accordance with a sixth embodiment.

In this case, as shown in FIG. 10, for example, by imparting a potential of +3V to a second electrode 104/1, a potential of 0V to second electrode 104/2 and a second electrode 104/4, and a potential of −3V to a second electrode 104/5, a reverse bias voltage of 3V can be simultaneously applied to the photoelectric conversion layer 103/1 and the photoelectric conversion layer 103/4 to perform simultaneous reverse biasing of these photoelectric conversion layers. In doing so, a voltage is not applied to the photoelectric conversion element 103/2 and the photoelectric conversion layer 103/3 positioned between the photoelectric conversion layer 103/1 and the photoelectric conversion layer 103/4, simultaneously subjected to reverse biasing, and a problem that the photoelectric conversion layers operate in a forward direction as a transistor does not arise.

Further, in the case of the present sixth embodiment, by imparting a potential of 0V to the second electrode 104/3, all second electrodes 104/2 to 104/4, which are positioned between the photoelectric conversion layer 103/1 and the photoelectric conversion layer 103/4, simultaneously subjected to reverse biasing, may be brought into the same potential of 0 V.

Further, in the present embodiment, the second electrode 104/2 and the second electrode 104/4 are brought into the same potential of 0 V, but they may be brought into another potential. However, in doing so, it is necessary to prevent the photoelectric conversion layer 103/2 and the photoelectric conversion layer 103/3 from operating in a forward direction to pass a large current through these photoelectric conversion layers. A photoelectric conversion layer which is not subjected to reverse biasing like the photoelectric conversion layer 103/2 and the photoelectric conversion layer 103/3 preferably does not perform a forward bias operation. However, even though the photoelectric conversion layer performs the forward bias operation, if a current in a forward direction of such a level that the photoelectric conversion layer is not damaged is passed, or even though the current in a forward direction is passed, if the current is within a power capacity of a power source and an applied voltage is not lowered, this method can be used.

A reverse biasing method of the present sixth embodiment is effective for the case where the photoelectric conversion elements which need reverse biasing are separately placed and reverse biasing of these photoelectric conversion elements are simultaneously performed.

Seventh Embodiment

Figure 11:
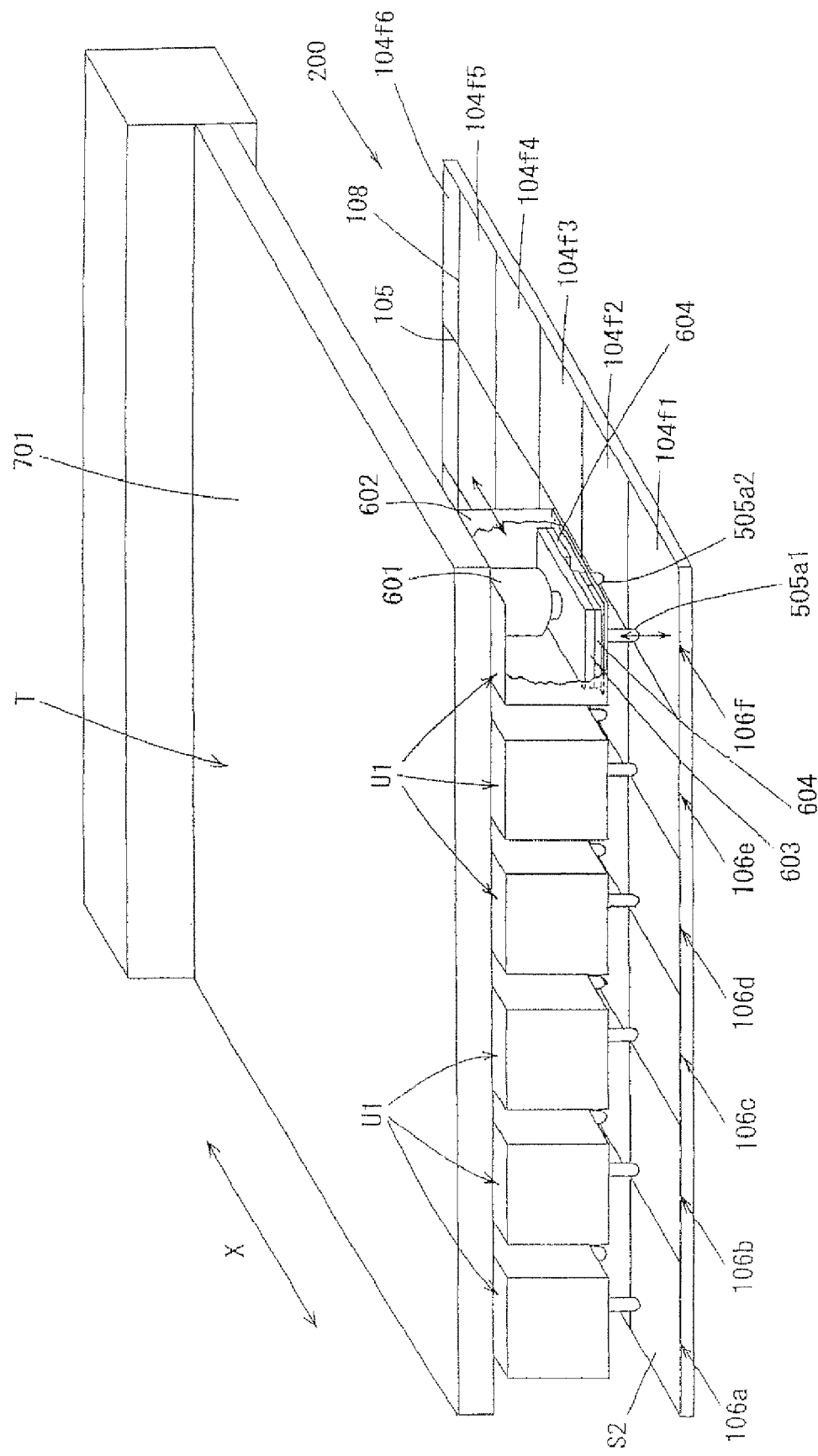
FIG. 11 is a schematic perspective view showing reverse biasing means in accordance with a seventh embodiment of the present invention, which can be used in the reverse biasing step of the second embodiment.

FIG. 11 is a schematic perspective view showing reverse biasing means in accordance with a seventh embodiment, which can be used in the reverse biasing step of the second embodiment. In addition, components in FIG. 11 similar to those described in FIG. 6 are denoted by the same symbols.

Figure 12:
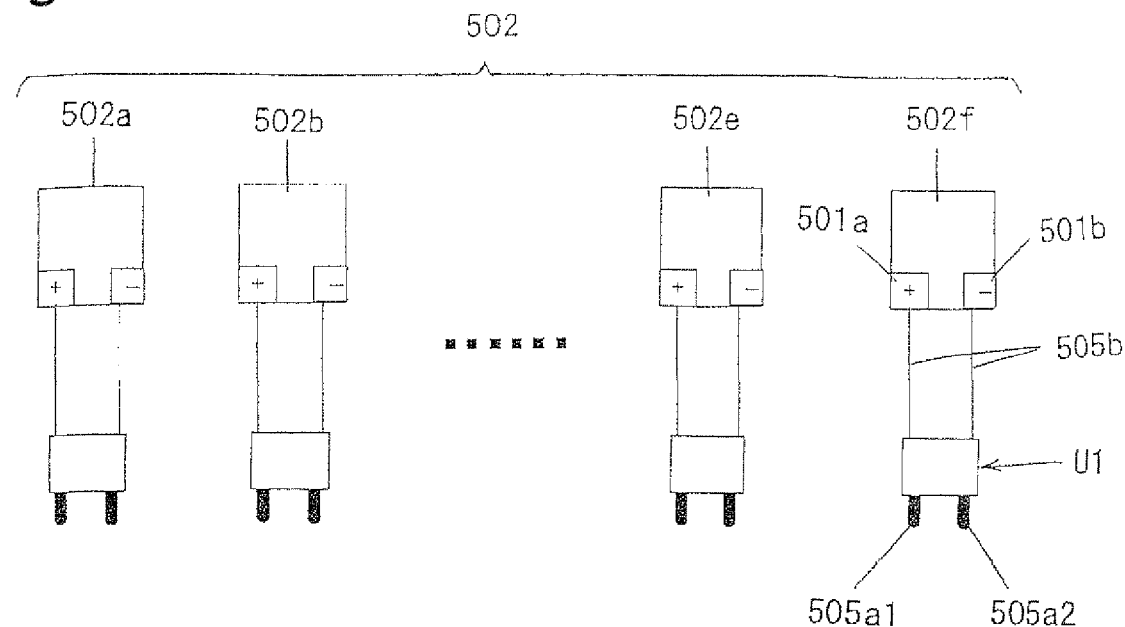
FIG. 12 is a conceptual view showing a power source of the reverse biasing means of the seventh embodiment.

As shown in FIG. 12, this reverse biasing means further includes a plurality of voltage applying units U1 each of which imparts a potential to two thin film photoelectric conversion elements (unit cells S2) in each of divided strings 106a to 106f and a moving mechanism T which moves each of the voltage applying units U1 in a serial connection direction (X-direction) in addition to a plurality of power sources 502 (502a to 502f) having output terminals 501a, 501b described in the second embodiment.

Figure 13:
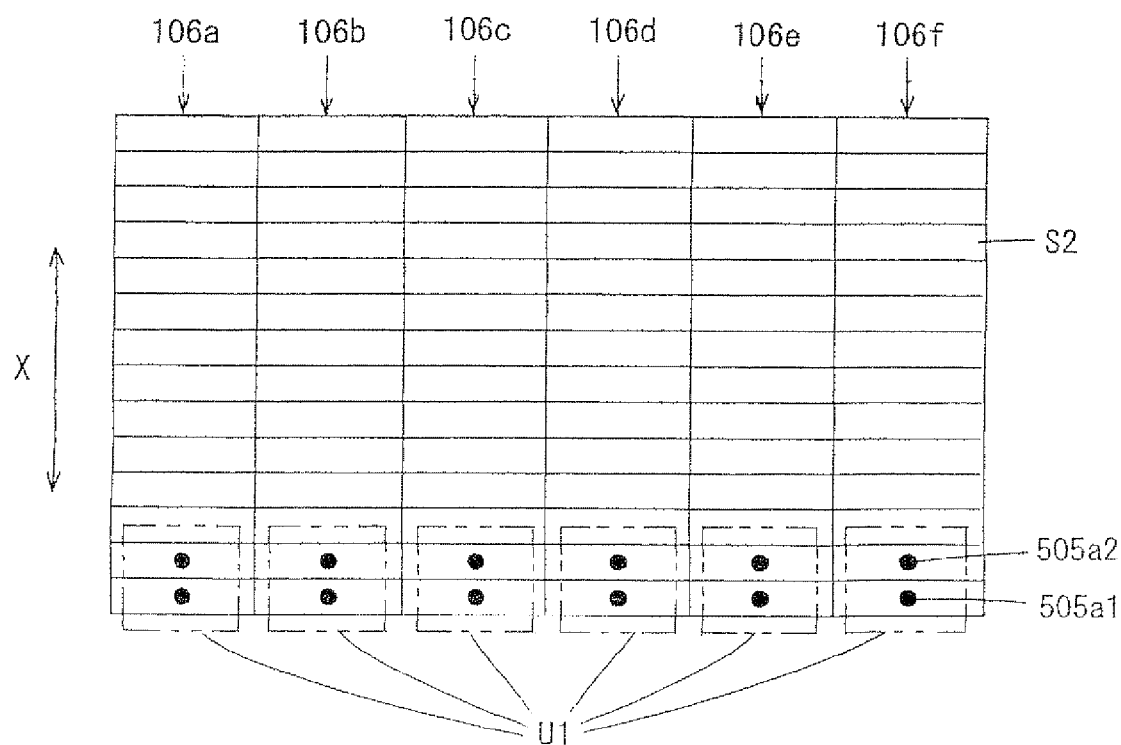
FIG. 13 is an arrangement view of voltage applying units of the reverse biasing means of the seventh embodiment.

FIG. 13 shows an arrangement of the plurality of voltage applying units U1 corresponding to the divided strings 106a to 106f.

The voltage applying unit U1 has two pin-type electrode connection portions 505a1 and 505a2 capable of being brought into contact with the second electrode layers of two thin film photoelectric conversion elements in the divided strings, a up-and-down driving portion 601 which connects the two electrode connection portions 505a1 and 505a2 to each other in a state of electrical insulation and raises/lowers the electrode connection portions 505a1 and 505a2, and a holding portion 602 to hold the up-and-down driving portion 601.

Specifically, the holding portion 602 is made of, for example, a box having a bottom opening. The up-and-down driving portion 601 is constructed of, for example, an extendable air cylinder and a main body of the air cylinder is fixed to an inner surface of the box so that a rod portion of the air cylinder can be moved toward a side of the bottom opening of the box in up and down direction. In addition, in this case, the moving mechanism T1 includes an air supply source not shown and a flexible air tube which is connected between the air supply source and the respective air cylinders to supply compressed air to the air cylinders.

Further, for example, a flat plate 603 is horizontally attached to a bottom end of the rod portion of the air cylinder, two conductive plate materials 604 are attached to the undersurface of the flat plate 603 at intervals, and the electrode connection portions 505a1 and 505a2 are combined into one on the undersurface of each of the conductive plate materials 604. These two conductive plate materials 604 are electrically connected to output terminals 501a, 501b of the power source 502 through wiring portions 505b, 505b.

Further, in order to secure the electrical insulation between the two conductive plate materials 604 and the electrical insulation between the two electrode connection portions 505a1 and 505a2, for example, the flat plate 603 is made of an insulating material, and the conductive plate materials 604 and the flat plate 603 are joined with bolts and nuts.

In addition, the wiring portions 505b, 505b and the air tubes are disposed on the undersurface of a substrate 701 of the moving mechanism T1 not to interfere with movements of the voltage applying units U1 in an X-direction. Alternatively, only members of the moving mechanism T may be located in a space on the undersurface of the substrate 701 by forming slits extending in an X-direction at a plurality of locations of the substrate 701 and drawing the wiring portions 505b, 505b and the air tubes through these slits to be drawn outside.

The moving mechanism T is connected to the holding portions 602 of the plurality of voltage applying units U1, and constructed so as to enable the holding portions 602 to move in a direction X of serial connection in conjunction with one another or independently of one another. A specific configuration of the moving mechanism T is not particularly limited, and for example, a ball screw mechanism, a band wheel mechanism (pulley mechanism), a chain sprocket mechanism and the like can be employed.

Figure 16:
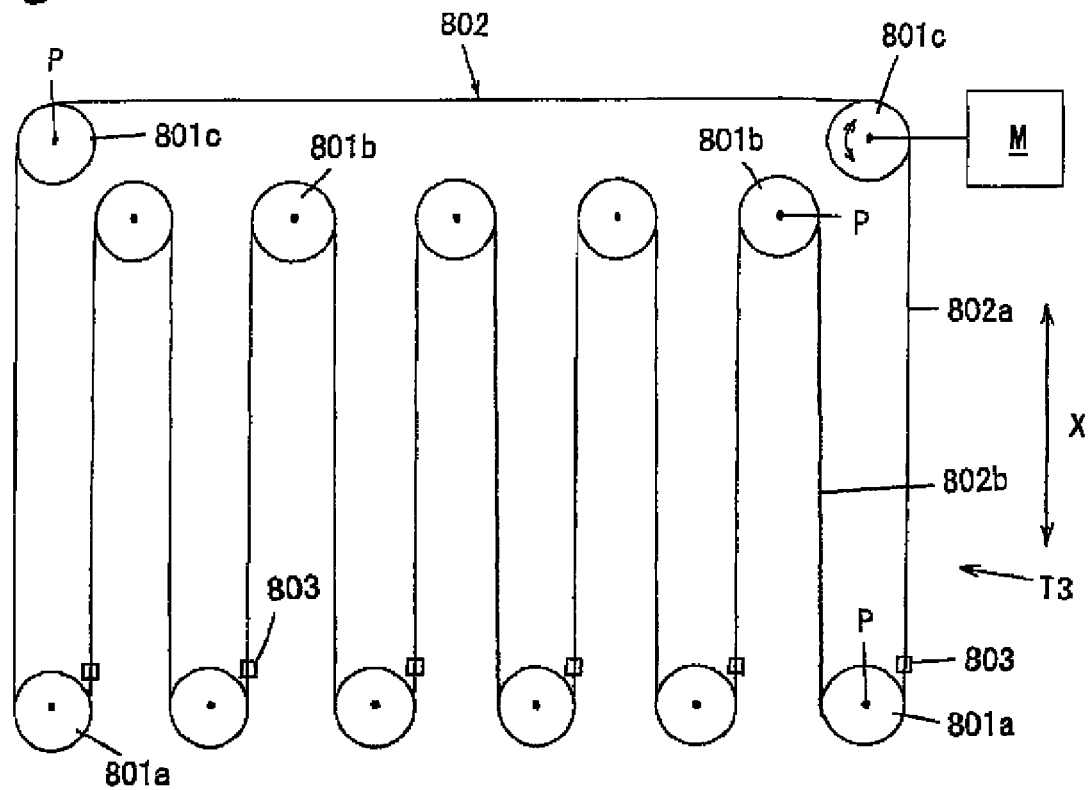
FIG. 16 is a schematic configuration diagram showing a third example of the moving mechanism of the reverse biasing means of the seventh embodiment.
Figure 17:
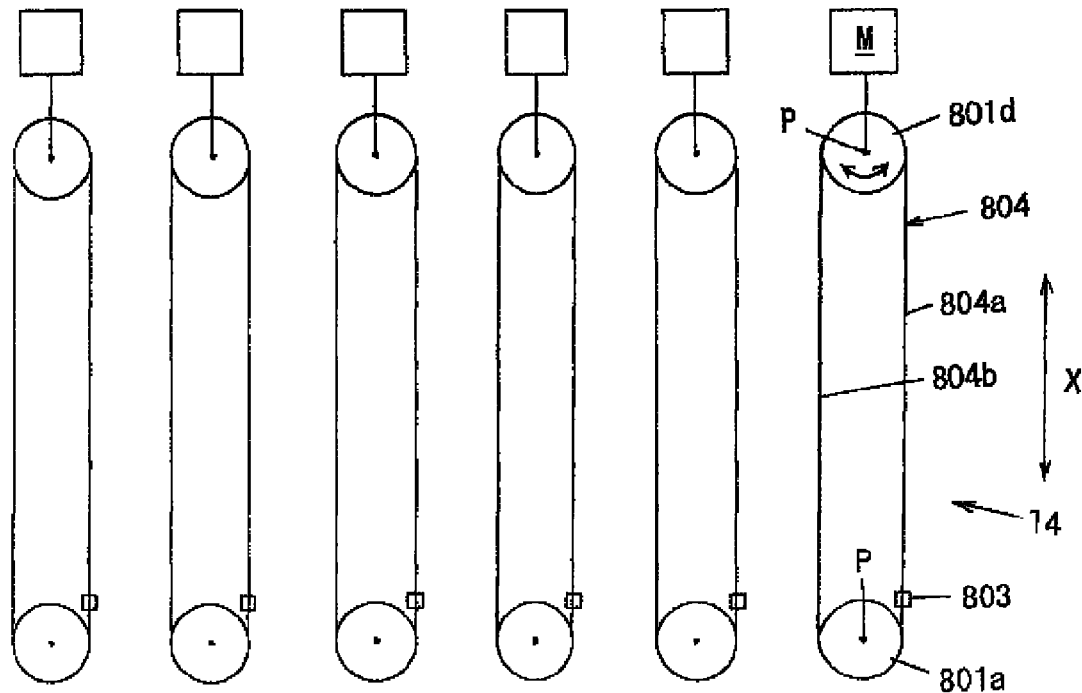
FIG. 17 is a schematic configuration diagram showing a fourth example of the moving mechanism of the reverse biasing means of the seventh embodiment.

Mechanisms in FIGS. 14 and 15 are exemplified as the ball screw mechanism, and mechanisms in FIGS. 16 and 17 are exemplified as the band wheel mechanism.

<First Example of Moving Mechanism>

FIG. 14 shows a moving mechanism T1 in which the ball screw mechanism is employed and this mechanism interlocks a plurality of voltage applying unit U1.

This moving mechanism T1 includes the substrate 701 (see FIG. 11), a pair of parallel fixed pieces 702 fixed to both sides in an X-direction of the undersurface of the substrate 701, a plurality of screw shafts 703 mounted on the pair of fixed pieces 702 so as to be able to rotate, nut portions 704 in which the screw shafts 703 are screwed, first bevel gears 705 attached at rear ends of the screw shafts 703, a plurality of guide shafts 706 fixed to the pair of fixed pieces 702, a main screw shaft 707 which is placed on a side of rear ends of the screw shafts 703 and rotatably attached to the undersurface of the substrate 701, a motor M to rotate the main screw shaft 707, and a plurality of second bevel gears 708 which are attached to the main screw shaft 707 and engaged with the first bevel gears 705.

Each of the plurality of screw shafts 703 and each of the plurality of guide shaft 706 are disposed alternately and in parallel, and a set of one screw shaft 703 and one guide shaft 706 corresponds to one voltage applying unit U1.

In the voltage applying units U1, an upper wall of the box as the holding portion is fixed to the nut portion 704 of the moving mechanism T1 and attached slidably to the guide shaft 706 through a mounting member not shown.

Since as described above, the voltage applying units U1 are attached to the moving mechanism T1 thus constructed, if the second bevel gears 708 are rotated together with, the main screw shaft 707 by the motor M of the moving mechanism T1, the screw shafts 703 are rotated together with the first bevel gears 705, and thereby the voltage applying units U1 are simultaneously moved in an X-direction with the nut portions.

In accordance with reverse biasing means including this moving mechanism T1, after electrode connection portions 505a1 of the voltage applying unit U1 are moved to a position above a unit cell S2 to be subjected to reverse biasing of the divided string, the electrode connection portions 505a1 and 505a2 are lowered by an up-and-down driving portion 601, and brought into contact with, the second electrode layers of two unit cells S2 to perform the reverse biasing described in the first embodiment. After the reverse biasing, the electrode connection portions 505a1 and 505a2 are raised, and reverse biasing of all unit cells S2 are performed by repeating similarly the operation of moving, lowering, reverse biasing and raising.

In accordance with the reverse biasing means, such a plurality of reverse biasing for a plurality of divided strings 106a to 106f can be concurrently performed. In addition, since the plurality of power sources 502a to 502f corresponding to voltage applying units U1 can be independently controlled in a on-off mode and the voltage applying units U1 can be independently raised and lowered, the power sources corresponding to unit cells S2, in which reverse biasing is finished, may be sequentially turned off, and the voltage applying unit U1 may be raised when a time of reverse biasing varies from unit cell S2 to unit cell 82 in the divided strings 106a to 106f. By doing so, energy of electric power can be saved and the voltage applying units U1 can be put in a standby state for performing reverse biasing of a next unit cell S2.

<Second Example of Moving Mechanism>

FIG. 15 shows a moving mechanism T2 in which a ball screw mechanism is employed and this mechanism enables a plurality of voltage applying unit U1 to move independently. In addition, in FIG. 15, members similar to those in FIG. 14 are denoted by the same symbols.

This moving mechanism T2 includes a plurality of motors to rotate separately the screw shafts 703 in place of omitting the main screw shaft 707 having the plurality of second bevel gears 708 and the motor to rotate the main screw shaft 707 in the above-mentioned moving mechanism T1. Other configurations and structures of attachment to the voltage applying units U1 in the moving mechanism T2 are similar to those of the moving mechanism T1.

In accordance with reverse biasing means including this moving mechanism T2, since motors M corresponding to voltage applying units U1 can be independently driven and controlled, the voltage applying units U1 can be separately moved at a timing according to reverse biasing of the divided strings 106*a* to 106*f* even though a time of reverse biasing varies from unit cell S2 to unit cell S2 in the divided strings 106*a* to 106*f*.

<Third Example of Moving Mechanism>

FIG. 16 shows a moving mechanism T3 in which a band wheel mechanism is employed and this mechanism interlocks a plurality of voltage applying unit U1.

This moving mechanism T3 includes the substrate 701 (see FIG. 11), a plurality of first, second and third pulleys 801*a*, 801*b*, 801*c* attached to predetermined positions of the undersurface of the substrate 701 so as to be able to rotate about a vertical axis P, an endless wire belt 802 looped around the plurality of first, second and third pulleys 801*a*, 801*b*, 801*c*, a motor M to rotate one third, pulley 801*c*, a plurality of connecting members 803 connecting between predetermined locations of the wire belt 802 and holding portions 602 (see FIG. 11) of a plurality of voltage applying units U1, and guide shafts not shown from which a plurality of voltage applying units U1 are suspended slidably in an X-direction.

The first pulley 801*a* is located at an end on a side on which reverse biasing in an X-direction of a substrate 701 is started, and the plurality of first pulleys 801*a* are aligned in parallel at positions corresponding to voltage applying units U1. The second pulley 801*b* is located at an end on a side on which reverse biasing in the X-direction of the substrate 701 is ended, and the plurality of second pulleys 801*b* are aligned in parallel between positions corresponding to voltage applying units U1. The third pulley 801*c* is located at a farther end than the second pulleys 801*b* of a side on which reverse biasing in the X-direction of the substrate 701 is ended, and two third pulleys 801*c* are placed at two positions opposite to the first pulleys 801*a* on both sides. One of the two third pulleys 801*c* is rotated by a motor M through its rotating shaft.

By looping the wire belt 802, as shown in FIG. 16, around the plurality of first, second and third pulleys 801*a*, 801*b*, 801*c* thus arranged, straight portions 802*a*, 802*b* of the wire belt 802 are parallel formed in the form of a pair at positions corresponding to the voltage applying unit U1. A pair of straight portions 802*a*, 802*b* move in the direction opposite to each other through the rotation of the third pulley 801*c* in one direction.

The connecting members 803 are fixed to the straight portions (for example, straight portions 802*a* in FIG. 16), which move in the same direction of plural pairs of straight portions 802*a*, 802*b*, at the same positions in an X-direction.

A plurality of guide shafts not shown are attached, at both ends, to a pair of parallel fixed pieces 702 fixed to the undersurface of the substrate 701 described in FIG. 14, and two guide shafts are disposed in a state of extending parallel in an X-direction for one voltage applying unit U1. Further, upper walls of the holding portions 602 of the voltage applying units U1 are suspended slidably from a pair of guide shafts through a mounting member not shown. In addition, this mounting member may be combined with the connecting member 803 to form one member.

In accordance with the moving mechanism T3, since straight portions 802*a* of a wire belt 802 move in the same direction at the same time by rotating the third pulley 801*c* in one direction or reverse direction with the motor M, the voltage applying units U1 can be simultaneously moved in an X-direction. Accordingly, in accordance with reverse biasing means including this moving mechanism T3, a plurality of reverse biasing for a plurality of divided strings 106*a* to 106*f* can be concurrently performed as with the reverse biasing means including this moving mechanism T1. Further, it is possible to sequentially turn off the power sources corresponding to unit cells S2, in which reverse biasing is finished, and raise the voltage applying unit U1 to save energy of electric power and the voltage applying unit U1 can be put in a standby state for performing reverse biasing of a next unit cell S2.

In addition, pulleys in the moving mechanism T3 may be changed to chain sprockets and the endless wire belt 802 may be changed to endless chain.

<Fourth Example of Moving Mechanism>

FIG. 17 shows a moving mechanism T4 in which a band wheel mechanism is employed and this mechanism enables a plurality of voltage applying unit U1 to move independently. In addition, in FIG. 17, members similar to those in FIG. 16 are denoted by the same symbols.

This moving mechanism T4 includes a plurality of first pulleys 801*a* similar to those of the moving mechanism T3 described above, a plurality of second pulleys 801*d*, each of which is located at a position being on an end side of reverse biasing in the X-direction of the substrate 701 and being opposite to the first pulleys 801*a*, plural sets of endless wire belts 804 looped around the first pulley 801*a* and the second pulley 801*b* paired, and a plurality of motors M to separately rotate the second pulleys 801*b*.

Further, connecting members 803 similar to that of the moving mechanism T1 are fixed to one of a pair of straight portions 804*a* and 804*b* in the wire belts 804 (straight portions 804*a* are employed in FIG. 17) in addition, other configurations and structures of attachment to the voltage applying units U1 in the moving mechanism T4 are similar to those of the moving mechanism T3.

In accordance with reverse biasing means including this moving mechanism T4, since motors M corresponding to voltage applying units U1 can be independently driven and controlled as with the moving mechanism T2, the voltage applying units U1 can be separately moved at a timing according to reverse biasing of the divided strings 106*a* to 106*f* (see FIG. 11) even though a time of reverse biasing varies from unit cell S2 to unit cell S2 in the divided strings 106*a* to 106*f*.

Eighth Embodiment

Figure 18:
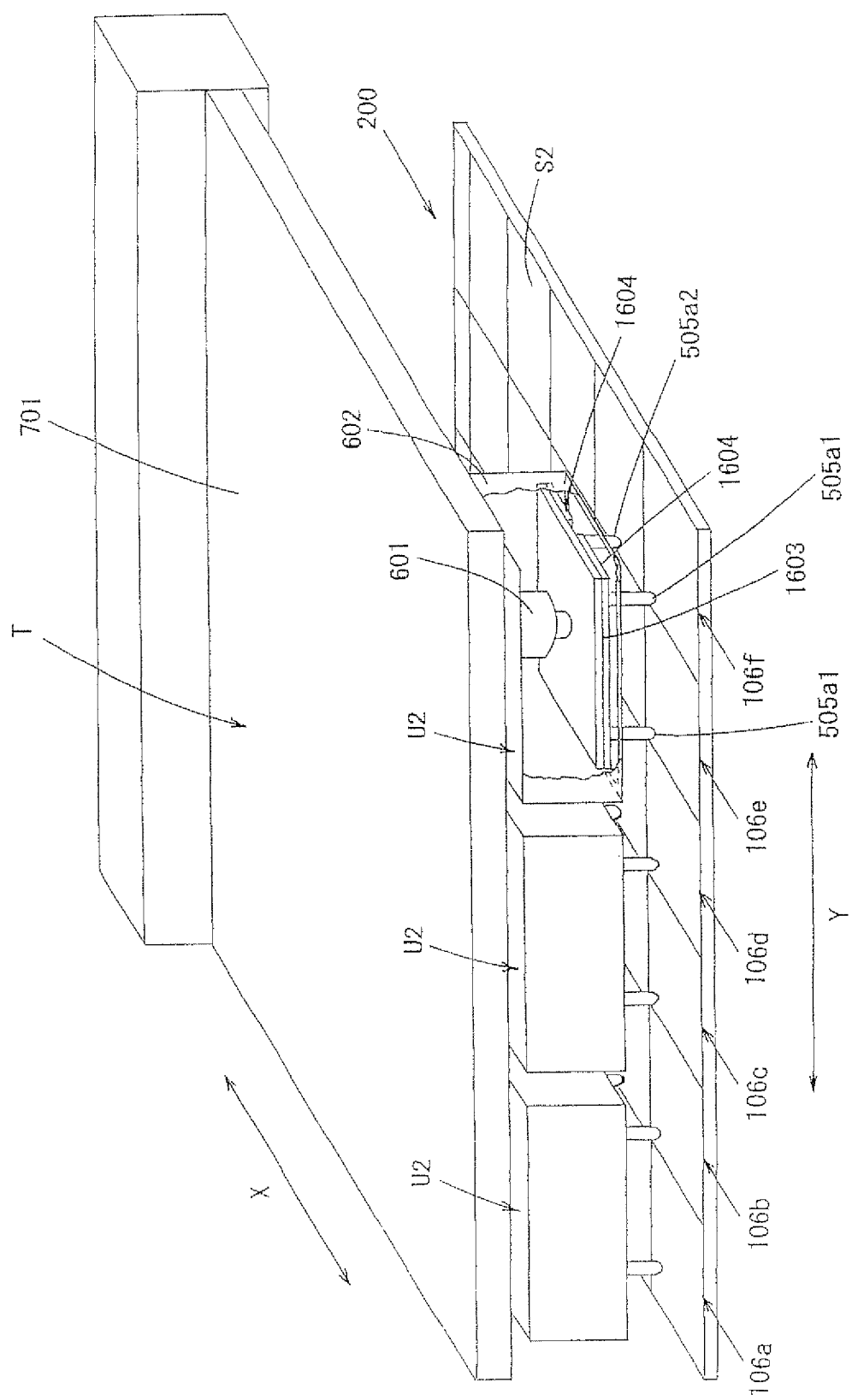
FIG. 18 is a schematic perspective view showing reverse biasing means in accordance with an eighth embodiment of the present invention, which can be used in the reverse biasing step of the second embodiment.

FIG. 18 is a schematic perspective view showing reverse biasing means in accordance with an eighth embodiment, which can be used in the reverse biasing step of the second embodiment. In addition, components in FIG. 18 similar to those described in FIGS. 6 and 11 are denoted by the same symbols.

Figure 19:
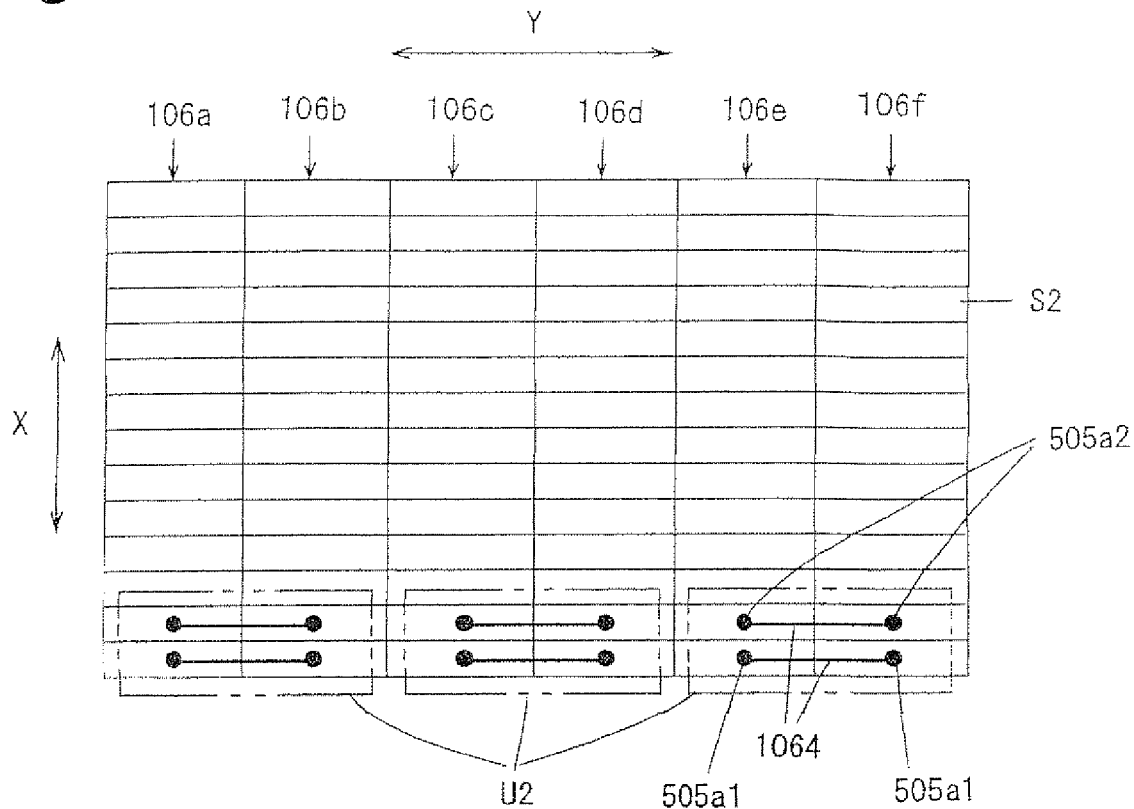
FIG. 19 is an arrangement view of voltage applying units of the reverse biasing means of the eighth embodiment.

As shown in FIGS. 18 and 19, the reverse biasing means of the eighth embodiment includes a plurality of voltage applying units U2 which are brought into contact with the second electrode layers of even number of four or more unit cells S2 in a plurality of divided strings 106*a* to 106*f* adjacent to one another to impart a potential to these second electrode layers, and a moving mechanism T which moves each voltage applying unit U2 in a serial connection direction (X-direction) in addition to the plurality of power sources 502 (502*a* to 502*f*) having the output terminals 501*a*, 501*b* described in the second embodiment.

The voltage applying unit U2 has a plural pairs of pin-type electrode connection portions 505*a*1 and 505*a*2 capable of being brought into contact with the second electrode layers of two unit cells S2 in the divided strings, wirings 1064 which are electrically connected between a plurality of electrode connection portions 505*a*1 capable of being brought into contact with a plurality of unit cells S2 adjacent to one another in a direction (Y-direction) orthogonal to an X-direction in the divided strings, a up-and-down driving portion 601 which connects the electrode connection portions 505a1 and 505a2 paired in a serial connection direction to each other in a state of electrical insulation to form a plural pairs of electrode connection portions and raises/lowers the plural pairs of electrode connection portions 505a1, 505a2, and a holding portion 602 to hold the up-and-down driving portion 601.

That is, the voltage applying units U2 of the reverse biasing means in the eighth embodiment has a structure like a combination of two voltage applying units U1 adjacent to each other in the seventh embodiment in one, and the moving mechanism T is constructed so as to enable a plurality of voltage applying units U2 to move in an X-direction in conjunction with one another or independently of one another as with the seventh embodiment and the above-mentioned moving mechanisms T1 to T4 can be adopted as this moving mechanism.

In addition, FIG. 19 shows an arrangement of a plurality of voltage applying units U2 corresponding to the divided strings 106a to 106f.

Specifically, a voltage applying unit U2 includes, for example, four electrode connection portions 505a1 and 505a2 which are brought into contact with the second electrode layers of four unit cells S2 adjacent to one another of two divided strings 106e and 106f, the above-mentioned wirings 1604, 1604 made of a conductive plate material, which is connected between two electrode connection portions 505a1, 505a1 adjacent to each other in a Y-direction and two electrode connection portions 505a2, 505a2 adjacent to each other in a Y-direction, a flat plate 603 which connects the two wirings 1604, 1604 to each other in a state of electrical insulation, an air cylinder as a up-and-down driving portion 601 connected to the flat plate 603, a box having a bottom opening as a holding portion 602 to secure the air cylinder, and an air supply source which supplies compressed air to the air cylinders through a flexible air tube not shown.

Further, the output terminals 501a and 501b of the power source 502 are connected to the wires 1604, 1604. Therefore, the same potential is imparted to the two electrode connection portions 505a1 and 505a1 and the same potential is imparted to the other two electrode connection portions 505a2 and 505a2.

Since the voltage applying units U2 of the eighth embodiment is thus constructed, number of the voltage applying units and the power sources are reduced to half of that of the seventh embodiment.

In accordance with the reverse biasing of the eighth embodiment thus constructed, reverse biasing of the divided strings 106a to 106f can be performed according to the second embodiment while moving a plurality of voltage applying units U2 in an X-direction in conjunction with one another or independently of one another by the adopted moving mechanisms T1 to T4. Furthermore, a configuration of the reverse biasing of the eighth embodiment is simpler than that of the seventh embodiment and therefore it can be manufactured at low cost.

Ninth Embodiment

Figure 20:
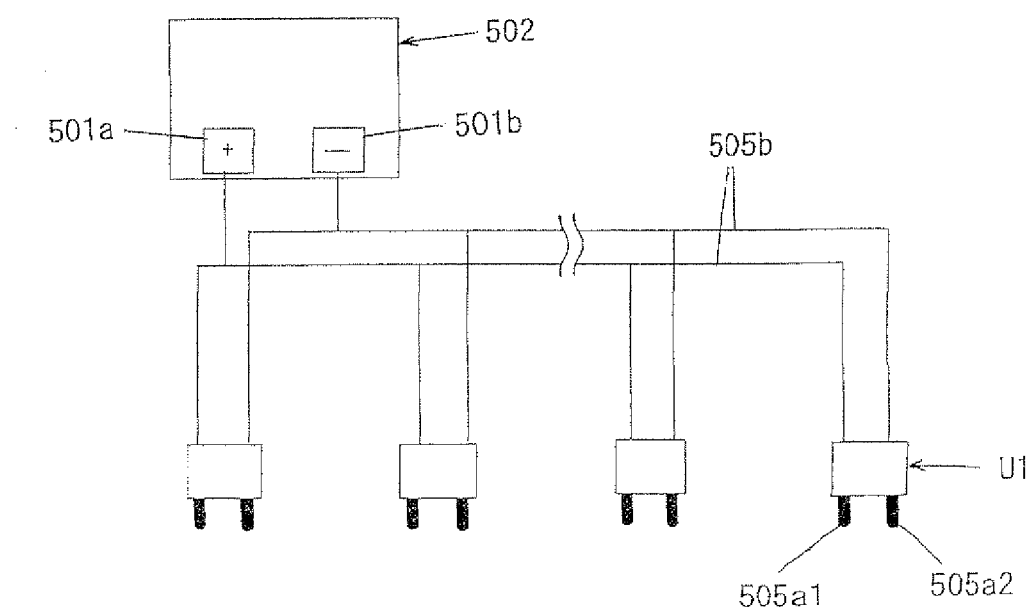
FIG. 20 is a conceptual view showing a power source of reverse biasing means in accordance with a ninth embodiment of the present invention.

The seventh and the eighth embodiments described above show the case where power sources 502a to 502f are separately provided for voltage applying units U1 (or voltage applying units U2) (see FIG. 12), but in the ninth embodiment, one power source 502 may be connected to a plurality of voltage applying units U1 (or voltage applying units U2) in parallel as shown FIG. 20.

In this case, since the same potential is imparted to all electrode connection portions 505a1 aligned in a Y-direction and the same potential is imparted to all other electrode connection portions 505a2 aligned in a Y-direction, one power source can cover all required potentials, and the production cost of reverse biasing means can be reduced by virtue of the significant reduction in number of power sources.

In addition, in the ninth embodiment, as configurations of the voltage applying unit and the moving mechanism, the configurations of the seventh or eighth embodiment cab be employed, but when the moving mechanism. T2 or T4 is used, wiring portions 505b, 505b are disposed with attention not to interfere with movements of the voltage applying units in an X-direction.

Other Embodiment

In the eighth embodiment, the case where the voltage applying unit U2 is constructed so as to perform the reverse biasing of two divided strings by one voltage applying unit is exemplified, but the voltage applying unit U2 may be constructed so as to perform the reverse biasing of three to all divided strings by one voltage applying unit. By doing so, number of component parts of the voltage applying unit and the moving mechanism can be more reduced, and therefore the production cost can be more reduced. In this case, number of up-and-down driving portions and power sources, and a configuration of connection between the power sources and the voltage applying units can also be appropriately selected.

The invention claimed is:

1. A method for manufacturing a thin film photoelectric conversion module comprising the steps of:
   (A) laminating a first electrode layer, a photoelectric conversion layer and a second electrode layer sequentially on the surface of an insulating substrate to form thin film photoelectric conversion elements and electrically connecting a plurality of the resulting thin film photoelectric conversion elements thereby forming a string;
   (B) dividing the string by dividing grooves into a plurality of divided strings, each first electrode layer and each second electrode layer of the divided strings being electrically insulated and separated, the divided strings extending in a serial connection direction; and
   (C) performing reverse biasing by applying a reverse bias voltage to each of thin film photoelectric conversion elements of at least one of the divided strings.

2. The method for manufacturing a thin film photoelectric conversion module of claim 1, wherein in the step (C), power sources varying from the divided string to the divided string of at least two divided strings are used to simultaneously perform reverse biasing.

3. The method for manufacturing a thin film photoelectric conversion module of claim 1, wherein in the step (A), the dividing grooves are formed so as to electrically connect the plurality of divided strings in parallel with one another.

4. The method for manufacturing a thin film photoelectric conversion module of claim 1, wherein in the step (C), different potentials are simultaneously imparted to second electrode layers of at least three thin film photoelectric conversion elements in the same divided string, and thereby reverse biasing of at least two thin film photoelectric conversion elements of the three thin film photoelectric conversion elements are simultaneously performed.

5. The method for manufacturing a thin film photoelectric conversion module of claim 1, wherein in the step (C), different potentials are imparted to the second electrode layers of all thin film photoelectric conversion elements in the same divided string, and thereby reverse biasing of all thin film photoelectric conversion elements are performed at once.

6. The method for manufacturing a thin film photoelectric conversion module of claim 1, wherein in the step (C), a reverse bias voltage applied to the thin film photoelectric conversion element is a withstand voltage of the thin film photoelectric conversion element or less.

7. A method for analyzing a thin film photoelectric conversion module comprising a plurality of divided strings by dividing a string, in which thin film photoelectric conversion elements provided by subsequently laminating a first electrode layer, a photoelectric conversion layer and a second electrode layer on the surface of an insulating substrate are electrically connected in series, into a plurality of divided strings by one or more dividing grooves, electrically insulating and separating the first electrode layer and the second electrode layer one from the other and extending in a serial connection direction, wherein the amounts of currents passing through the thin film photoelectric conversion elements by applying a reverse bias voltage to the thin film photoelectric conversion elements in at least one of said divided strings are measured.

8. A method for manufacturing a thin film photoelectric conversion module comprising the steps of:
 (A) laminating a first electrode layer, a photoelectric conversion layer and a second electrode layer sequentially on the surface of an insulating substrate to form thin film photoelectric conversion elements and electrically connecting a plurality of the resulting thin film photoelectric conversion elements thereby forming a string;
 (B) dividing the string by dividing grooves into a plurality of divided strings, each first electrode layer and each second electrode layer of the divided strings being electrically insulated and separated, the divided strings extending in a serial connection direction; and
 (C) performing reverse biasing by power sources simultaneously applying reverse bias voltages to each of the thin film photoelectric conversion elements of at least two of the divided strings, wherein the power sources varying from the divided string to the divided string of at least two divided strings are used.

* * * * *